(12) United States Patent
You et al.

(10) Patent No.: US 9,536,825 B2
(45) Date of Patent: Jan. 3, 2017

(54) SEMICONDUCTOR DEVICE AND METHOD FOR FABRICATING THE SAME

(71) Applicant: Samsung Electronics Co., Ltd., Suwon-si, Gyeonggi-do (KR)

(72) Inventors: Jung-Gun You, Ansan-si (KR); Wei-Hua Hsu, Seongnam-Si (TW); Choong-Ho Lee, Yongin-si (KR); Hyung-Jong Lee, Osan-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/712,136

(22) Filed: May 14, 2015

(65) Prior Publication Data
US 2016/0141243 A1    May 19, 2016

(30) Foreign Application Priority Data
Nov. 19, 2014    (KR) .................. 10-2014-0161944

(51) Int. Cl.
*H01L 21/70* (2006.01)
*H01L 23/522* (2006.01)
*H01L 27/092* (2006.01)
*H01L 27/088* (2006.01)
*H01L 23/485* (2006.01)
*H01L 23/532* (2006.01)

(52) U.S. Cl.
CPC ......... *H01L 23/5226* (2013.01); *H01L 23/485* (2013.01); *H01L 27/0883* (2013.01); *H01L 27/0886* (2013.01); *H01L 27/092* (2013.01); *H01L 23/53223* (2013.01); *H01L 23/53238* (2013.01); *H01L 23/53266* (2013.01); *H01L 2924/0002* (2013.01)

(58) Field of Classification Search
CPC ............... H01L 21/823412; H01L 21/823425; H01L 21/823807; H01L 29/7843; H01L 23/5226; H01L 23/535; H01L 27/0883; H01L 27/0886; H01L 27/092; H01L 21/8238; H01L 21/8228; H01L 27/0826; H01F 17/00; H01F 17/0013
USPC ....................................... 257/369, 295, 377
See application file for complete search history.

(56) References Cited

U.S. PATENT DOCUMENTS 7,329,581 B2    2/2008    Kang et al.
7,354,819 B2    4/2008    Nakajima et al.
7,384,850 B2    6/2008    Ahn et al.
(Continued)

*Primary Examiner* — Mohammed Shamsuzzaman
(74) *Attorney, Agent, or Firm* — Harness, Dickey & Pierce, PLC

(57) ABSTRACT

A semiconductor device and a method of fabricating the same are provided. The semiconductor device includes a substrate including a first region and a second region, a first transistor and a second transistor formed on the first region and the second region, respectively, a first contact formed on the first transistor, and a second contact formed on the second transistor. The first contact includes a first work function control layer having a first thickness and a first conductive layer formed on the first work function control layer, the second contact includes a second work function control layer having a second thickness different from the first thickness and a second conductive layer formed on the second work function control layer, and the first contact and the second contact have different work functions.

11 Claims, 25 Drawing Sheets

(56) References Cited

U.S. PATENT DOCUMENTS

| | | | |
|---|---|---|---|
| 8,084,826 B2 * | 12/2011 | Kanegae | H01L 21/82341 |
| | | | 257/199 |
| 8,404,544 B1 | 3/2013 | Yin et al. | |
| 8,546,211 B2 | 10/2013 | Wong et al. | |
| 8,546,212 B2 | 10/2013 | Su et al. | |
| 8,580,628 B2 | 11/2013 | Labonte et al. | |
| 8,741,757 B2 | 6/2014 | Jagannathan et al. | |
| 8,765,502 B2 | 7/2014 | Assefa et al. | |
| 8,809,930 B2 | 8/2014 | Jeon et al. | |
| 2006/0157795 A1 * | 7/2006 | Chen | H01L 21/82380 |
| | | | 257/369 |
| 2006/0175642 A1 * | 8/2006 | Dote | H01L 27/11502 |
| | | | 257/295 |
| 2010/0123198 A1 * | 5/2010 | Kim | H01L 21/26506 |
| | | | 257/377 |
| 2013/0140643 A1 | 6/2013 | Chen et al. | |
| 2013/0178056 A1 | 7/2013 | Zhu et al. | |
| 2013/0309857 A1 | 11/2013 | Koburger, III et al. | |
| 2013/0323919 A1 | 12/2013 | Teo et al. | |
| 2014/0187039 A1 | 7/2014 | Kauerauf et al. | |
| 2015/0243565 A1 * | 8/2015 | Nieh | H01L 21/82387 |
| | | | 257/369 |

* cited by examiner

1400

SEMICONDUCTOR DEVICE AND METHOD FOR FABRICATING THE SAME

CROSS-REFERENCE TO RELATED APPLICATION

This application claims priority from Korean Patent Application No. 10-2014-0161944 filed on Nov. 19, 2014, the contents of which in its entirety are herein incorporated by reference.

BACKGROUND

1. Technical Field

The present inventive concepts relates to a semiconductor device and a method for fabricating the same.

2. Description of the Related Art

As a feature size of transistors is reduced, a gate and a channel formed under the gate are becoming smaller. Therefore, methods to increase the capacitance between the gate and the channel and improve operating characteristics of the transistors are being developed.

One of these methods includes adjusting a threshold voltage by controlling a work function of a transistor. The work function of the transistor may be controlled by, for example, implanting ions into a channel region of the transistor. However, as the feature size of transistors is reduced and a shape of transistors becomes three-dimensional, it is becoming difficult to control the distribution of implanted ions.

SUMMARY

According to an aspect of the present inventive concepts, there is provided a semiconductor device including a substrate including a first region and a second region, a first transistor and a second transistor formed on the first region and the second region, respectively, a first contact formed on the first transistor, and a second contact formed on the second transistor, wherein the first contact includes a first work function control layer having a first thickness and a first conductive layer formed on the first work function control layer, the second contact includes a second work function control layer having a second thickness different from the first thickness and a second conductive layer formed on the second work function control layer, and the first contact and the second contact have different work functions.

According to another aspect of the present inventive concepts, there is provided a semiconductor device including a substrate including a first region and a second region, a first transistor and a second transistor formed on the first region and the second region, respectively, a first contact formed on the first transistor, and a second contact formed on the second transistor, wherein the first contact includes a first work function control layer formed under the first contact and a first conductive layer formed on the first work function control layer, the second contact includes a second work function control layer formed under the second contact and a second conductive layer formed on the second work function control layer, the second work function control layer includes a different material from the first work function control layer or includes a material having a different concentration from the first work function control layer, and the first contact and the second contact have different work functions.

According to still another aspect of the present inventive concepts, there is provided a semiconductor device including a substrate including a first region and a second region, a first transistor and a second transistor formed on the first region and the second region, respectively, a first interlayer insulation layer covering the first transistor and the second transistor, a first contact hole formed in the first interlayer insulation layer and exposing a portion of the first transistor, a second contact hole formed in the first interlayer insulation layer and exposing a portion of the second transistor, a first work function control layer conformally formed on an inner surface of the first contact hole, and a second work function control layer conformally formed on an inner surface of the second contact hole, wherein the first work function control layer and the second work function control layer are formed to different thicknesses, include different materials and include the same metal with different concentrations.

BRIEF DESCRIPTION OF THE DRAWINGS

The above and other features and advantages of the present inventive concepts will become more apparent by describing in detail example embodiments thereof with reference to the attached drawings in which.

DETAILED DESCRIPTION OF THE EMBODIMENTS

Figure 1:
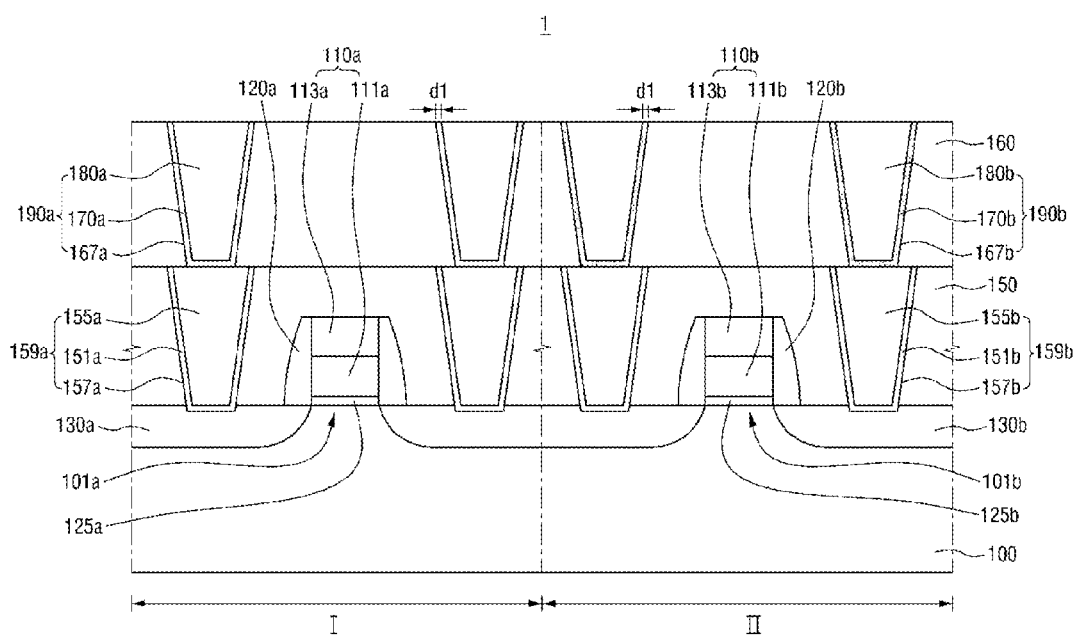
FIG. 1 illustrates a semiconductor device according to a first embodiment of the present inventive concepts.

Advantages and features of the present inventive concepts and methods of accomplishing the same may be understood more readily by reference to the following detailed description of preferred embodiments and the accompanying drawings. The present inventive concepts may, however, be embodied in many different forms and should not be construed as being limited to the embodiments set forth herein. Rather, these embodiments are provided so that this disclosure will be thorough and complete and will fully convey the concepts of the inventive concepts to those skilled in the art, and the present inventive concepts will only be defined by the appended claims. Like reference numerals refer to like elements throughout the specification.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the present inventive concepts belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, semiconductor devices according to embodiments of the present inventive concepts and a method for fabricating the same will now be described with reference to FIGS. 1 to 25.

FIG. 1 illustrates a semiconductor device according to a first embodiment of the present inventive concepts.

Referring to FIG. 1, the semiconductor device 1 includes a substrate 100, a first transistor 101a, a second transistor 101b, a first contact plug 159a, a second contact plug 159b, a first contact 190a, a second contact 190b, and interlayer insulation layers 150 and 160.

The substrate 100 may be, for example, a semiconductor substrate. The substrate 100 may include one of silicon (Si), strained Si, silicon (Si) alloy, silicon carbide (SiC), silicon germanium (SiGe), silicon germanium carbide (SiGeC), germanium, germanium alloy, gallium arsenide (GaAs), indium arsenide (InAs), III-V semiconductor, II-VI semiconductor, or combinations thereof, and a stacked structure thereof. In an embodiment, the substrate 100 may be an organic plastic substrate 10, rather than the semiconductor substrate. The following description will be made with regard to a case where the substrate 100 includes silicon (Si).

The substrate 100 may be of a P type or an N type. In some embodiments of the present inventive concepts, an insulating substrate may be used as the substrate 100. A silicon-on-insulator (SOI) substrate may be used as the substrate 100. When the SOI substrate is used, a delay time during the operation of the semiconductor device 1 can be reduced.

The substrate 100 may include a first region I and a second region II. The first transistor 101a may be formed on the first region I of the substrate 100 and the second transistor 101b may be formed on the second region II of the substrate 100. The first transistor 101a and the second transistor 101b may have different conductivity types. In an embodiment, the first region I may be, for example, a PFET region where a P-type transistor is formed, and the second region II may be, for example, an NFET region where an N-type transistor is formed. In an embodiment, the first transistor 101a may be a PFET and the second transistor 101b may be an NFET, but aspects of the present inventive concepts are not limited thereto.

The first transistor 101a may include gate structures 110a, 120a and 125a and a source or drain 130a. The second transistor 101b may include gate structures 110b, 120b and 125b and a source or drain 130b. The second transistor 101b may be formed and may operate in substantially the same manner with the first transistor 101a. The following description will be made with regard to the first transistor 101a by way of example.

The source or drain 130a may be formed in the substrate 100 between gate structures adjacent to each other. In an embodiment, the source or drain 130a may be formed in an active layer. The source or drain 130a may include an element semiconductor material, such as silicon (Si) or germanium (Ge). The source or drain 130a may include a compound semiconductor. The source or drain 130a may include, for example, a Group IV-IV compound semiconductor or a Group III-V compound semiconductor. As an example of a Group IV-IV compound semiconductor, an epitaxial layer may be a binary compound including at least two of carbon (C), silicon (Si), germanium (Ge), and tin (Sn), a ternary compound, or a compound in which Group IV elements are doped in the binary compound or the ternary compound. As an example of a Group III-V compound semiconductor, an epitaxial layer may be one of a binary compound, a ternary compound, or a quaternary compound which is formed by coupling at least one of aluminum (Al), gallium (Ga), and indium (In) as Group III elements and one of phosphorus (P), arsenic (As) and antimony (Sb) as Group V elements. The source or drain 130a may have an LDD structure, but aspects of the present inventive concepts are not limited thereto.

The gate structure 105 may include a gate electrode 110a, a spacer 120a, and a gate insulation layer 125a.

The gate insulation layer 125a may be disposed between the substrate 100 and the gate electrode 110a. The gate insulation layer 125a may include a high-k layer. When the gate insulation layer 125a is a high-k layer, it may be made of a high-k material. In some embodiments of the present inventive concepts, the high-k material may include, for example, HfO2, Al2O3, ZrO2, and TaO2, but aspects of the present inventive concepts are not limited thereto.

The gate electrode 110a may include a conductive layer 111a and a hard mask layer 113a. The conductive layer 111a may be a single layer of a polysilicon layer, a silicide layer or a metal layer or a stacked layer of these layers. The gate electrode 110a may be configured such that the hard mask layer 113a is positioned on the conductive layer 111a.

The spacer 120a may be disposed on at least one side of the gate electrode 110a. Referring to FIG. 1, the spacer 120a may be disposed on opposite sides of the gate electrode 110a. The spacer 120a may include at least one of a nitride layer and an oxynitride layer. In FIG. 1, one side surface of the spacer 120a is curved, but aspects of the present inventive concepts are not limited thereto. The shape of the spacer 120a may vary in many ways. For example, the spacer 120a may have substantially I-shaped or L-shaped.

The interlayer insulation layers 150 and 160 may be formed on the substrate 100. The interlayer insulation layers 150 and 160 may be formed to cover the first transistor 101a and the second transistor 101b. The interlayer insulation layers 150 and 160 may electrically insulate semiconductor devices positioned under the interlayer insulation layers 150 and 160 from semiconductor devices positioned on the interlayer insulation layers 150 and 160. The interlayer insulation layers 150 and 160 may be formed using silicon oxide, such as borosilicate glass (BSG), phosphosilicate glass (PSG), borophosphosilicate glass (BPSG), undoped silicate glass (USG), tetraethylorthosilicate glass (TEOS), or high density plasma-chemical vapor deposition (HDP-CVD), but aspects of the present inventive concepts are not limited thereto. The interlayer insulation layers 150 and 160 may include a first interlayer insulation layer 150 and a second interlayer insulation layer 160. The second interlayer insulation layer 160 may be formed on the first interlayer insulation layer 150.

A first contact plug 159a may be formed on the source or drain 130a of the first transistor 101a. Likewise, a second contact plug 159b may be formed on the source or drain 130b of the second transistor 101b.

The first contact plug 159a may include a first trench 157a, a first barrier metal 151a, and a first conductive layer 155a. The second contact plug 159b may include a second trench 157b, a second barrier metal 151b, and a second conductive layer 155b. The second contact plug 159b may be formed in substantially the same manner with the first contact plug 159a. The following description will be made with regard to the first contact plug 159a by way of example.

The first trench 157a may be formed in the first interlayer insulation layer 150 and may expose a portion of the first transistor 101a.

The first trench 157a may expose the source or drain 130a of the first transistor 101a. The first trench 157a may be formed by forming a photoresist pattern masking a remaining portion, excluding a contact plug forming region, on the first interlayer insulation layer 150 and etching the contact plug forming region exposed by the photoresist pattern, but aspects of the present inventive concepts are not limited thereto.

The first trench 157a may be tapered. In an embodiment, the first trench 157a may have a trapezoidal shape or an inverted trapezoidal shape, but aspects of the present inventive concepts are not limited thereto. The first trench 157a may have a rectangular shape. The first trench 157a may be formed by etching a portion of the source or drain 130a. For example, the first trench 157a may be formed to have a first depth from a top surface of the source or drain 130a, but aspects of the present inventive concepts are not limited thereto.

The first barrier metal 151a may be conformally formed on the inner surface of the first trench 157a. That is to say, the first barrier metal 151a may be formed on opposite lateral surfaces and a bottom surface of the first trench 157a to a desired (or, alternatively a predetermined) thickness. Alternatively, the first barrier metal 151a may be formed to a desired (or, alternatively a predetermined) thickness only on the bottom surface of the first trench 157a. The first barrier metal 151a may include titanium (Ti), titanium nitride (TiN) or tungsten nitride (WN). The first barrier metal 151a may be formed by PVD, CVD or ILD, but aspects of the present inventive concepts are not limited thereto.

The first conductive layer 155a may be formed on the first barrier metal 151a. The first conductive layer 155a may be formed to completely fill the inside of the first trench 157a. In an embodiment, a bottom surface of the first conductive layer 155a and a top surface of the source or drain 130a are positioned to be coplanar, but aspects of the present inventive concepts are not limited thereto. Alternatively, the bottom surface of the first conductive layer 155a may be positioned to be higher or lower than the top surface of the source or drain 130a. A top surface of the first conductive layer 155a and a top surface of the first barrier metal 151a may be positioned to be coplanar. The first conductive layer 155a may be electrically connected to the source or drain 130a of the first transistor 101a. The first conductive layer 155a may include tungsten (W), but aspects of the present inventive concepts are not limited thereto. The first conductive layer 155a may include, for example, at least one of polysilicon, a metal silicide compound, a conductive metal nitride and a metal.

A first contact 190a may be formed on the first contact plug 159a. The first contact 190a may include a first contact hole 167a, a first work function control layer 170a, and a third conductive layer 180a.

The first contact hole 167a may be formed in the second interlayer insulation layer 160 formed on the first interlayer insulation layer 150. The first contact hole 167a may be formed on the first contact plug 159a and may expose a top surface of the first contact plug 159a. The first contact 190a may be electrically connected to the source or drain 130a of the first transistor 101a through the first contact plug 159a. The first contact hole 167a may be formed by forming a photoresist pattern masking a remaining portion, excluding a contact plug forming region, on the second interlayer insulation layer 160 and etching the contact plug forming region exposed by the photoresist pattern, but aspects of the present inventive concepts are not limited thereto.

The first contact hole 167a may be tapered. The first contact hole 167a may have a trapezoidal shape or an inverted trapezoidal shape, but aspects of the present inventive concepts are not limited thereto. The first contact hole 167a may have a rectangular shape.

The first work function control layer 170a may be conformally formed on the inner surface of the first contact hole 167a. That is to say, the first work function control layer 170a may be formed on opposite lateral surfaces and a bottom surface of the first contact hole 167a to a first thickness d1, but aspects of the present inventive concepts are not limited thereto. The first work function control layer 170a may include a high-k material. The first work function control layer 170a may include, for example, a metal nitride. The first work function control layer 170a may include, for example, at least one of TiN and TaN. In more detail, the first work function control layer 170a may include, for example, a single layer made of TiN, or a dual layer made of a TiN lower layer and a TaN upper layer, but aspects of the present inventive concepts are not limited thereto.

In some embodiments of the present inventive concepts, the first work function control layer 170a may include a material selected from the group consisting of HfO2, ZrO2, Ta2O5, TiO2, SrTiO3, BaTiO3, and SrTiO3. The first work function control layer 170a may include a material selected from the group consisting of Ti, TiN, HfO, Ga, and Ge, but aspects of the present inventive concepts are not limited thereto.

The first work function control layer 170a may have a first thickness d1 according to a type of device to be formed. The first work function control layer 170a may be formed by PVD, CVD or ILD, but aspects of the present inventive concepts are not limited thereto.

The first work function control layer 170a of the first transistor 101a may be formed on the first contact plug 159a. In some embodiments of the present inventive concepts, the first work function control layer 170a may be formed to contact the first conductive layer 155a of the first contact plug 159a.

The second contact hole 167b may be formed in the second interlayer insulation layer 160 formed on the first interlayer insulation layer 150. The second contact hole 167b may be formed on the second contact plug 159b and may expose a top surface of the second contact plug 159b. The second contact 190b may be electrically connected to the source or drain 130b of the second transistor 101b through the second contact plug 159b. The second contact hole 167b may be formed in the same manner with the first contact hole 167a and the first contact hole 167a and the second contact hole 167b may be simultaneously or sequentially formed.

The third conductive layer 180a may be formed on the first work function control layer 170a. The third conductive layer 180a may be formed to completely fill the inside of the first contact hole 167a. A top surface of the third conductive layer 180a and a top surface of the first work function control layer 170a may be positioned to be coplanar. The third conductive layer 180a may be electrically connected to the source or drain 130a of the first transistor 101a. The third conductive layer 180a may include aluminum (Al), copper (Cu), or tungsten (W), but aspects of the present inventive concepts are not limited thereto. The third conductive layer 180a may include, for example, at least one of polysilicon, a metal silicide compound, a conductive metal nitride and a metal.

A second contact 190b may be formed on the second contact plug 159b. The second contact 190b may include a second contact hole 167b, a second work function control layer 170b and a fourth conductive layer 180b.

The second work function control layer 170b may be conformally formed on the inner surface of the second contact hole 167b. The second work function control layer 170b may be formed on opposite lateral surfaces and a bottom surface of the second contact hole 167b to a first thickness d1. The first work function control layer 170a and the second work function control layer 170b may be formed to the same thickness, that is, the first thickness d1.

The second work function control layer 170b may include a high-k material. The second work function control layer 170b may include, for example, a metal nitride. The second work function control layer 170b may include, for example, at least one of TiN and TaN. In more detail, the second work function control layer 170b may include, for example, a single layer made of TiN, or a dual layer made of a TiN lower layer and a TaN upper layer, but aspects of the present inventive concepts are not limited thereto.

In some embodiments of the present inventive concepts, the second work function control layer 170b may include a material selected from the group consisting of HfO2, ZrO2, Ta2O5, TiO2, SrTiO3, BaTiO3, and SrTiO3. The second work function control layer 170b may include a material selected from the group consisting of Ti, TiN, HfO, Ga, and Ge, but aspects of the present inventive concepts are not limited thereto. The second work function control layer 170b may include a different material from the first work function control layer 170a and may include a material having a different concentration from the first work function control layer 170a. For example, the first work function control layer 170a may not include a metal and the second work function control layer 170b may include a metal. In some embodiments of the present inventive concepts, the first work function control layer 170a and the second work function control layer 170b may be formed to the same thickness and may include the same metal. In an embodiment, a concentration of the metal included in the first work function control layer 170a may be different from a concentration of the metal included in the second work function control layer 170b.

The fourth conductive layer 180b may be formed on the second work function control layer 170b. The fourth conductive layer 180b may be formed to completely fill the inside of the second contact hole 167b. A top surface of the fourth conductive layer 180b and a top surface of the second work function control layer 170b may be positioned to be coplanar. The fourth conductive layer 180b may be electrically connected to the source or drain 130b of the second transistor 101b. The fourth conductive layer 180b may include aluminum (Al), copper (Cu), or tungsten (W), but aspects of the present inventive concepts are not limited thereto. The fourth conductive layer 180b may include, for example, at least one of polysilicon, a metal silicide compound, a conductive metal nitride and a metal. In addition, in some embodiments of the present inventive concepts, the fourth conductive layer 180b may include a different material from the third conductive layer 180a. For example, the third conductive layer 180a and the fourth conductive layer 180b may include different metals, but aspects of the present inventive concepts are not limited thereto. The third conductive layer 180a and the fourth conductive layer 180b may include the same material.

Since the second work function control layer 170b may include a different material from the first work function control layer 170a and may include a material having a different concentration from the first work function control layer 170a, the first contact 190a and the second contact 190b may have different work functions. Operating characteristics of the first transistor 101a and the second transistor 101b may be improved by adjusting the work function of the first contact 190a electrically connected to the first transistor 101a and the work function of the second contact 190b electrically connected to the second transistor 101b.

According to an embodiment, operating work functions of all of the transistors can be controlled by controlling work functions of contacts electrically connected to the respective transistors, thereby improving operating characteristics of the transistors, as desired by users. For example, the first transistor 101a and the second transistor 101b may be controlled to have the same threshold voltage using the first contact 190a and the second contact 190b having different work functions or may be controlled to operate with user's desired output, but aspects of the present inventive concepts are not limited thereto.

Figure 2:
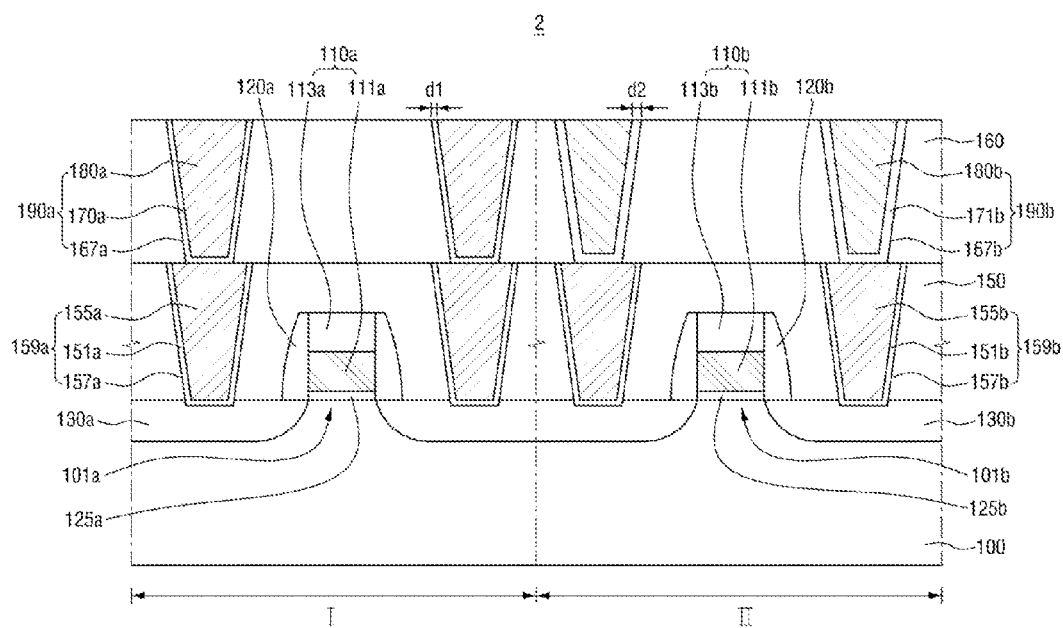
FIG. 2 illustrates a semiconductor device according to a second embodiment of the present inventive concepts.

FIG. 2 illustrates a semiconductor device according to a second embodiment of the present inventive concepts.

Referring to FIG. 2, the semiconductor device 2 according to the second embodiment of the present inventive concepts may be formed in substantially the same manner with the semiconductor device 1 shown in FIG. 1.

In the semiconductor device 2 according to the second embodiment of the present inventive concepts, a first work function control layer 170a may be conformally formed on an inner surface of a first contact hole 167a. The first work function control layer 170a may be formed on opposite lateral surfaces and a bottom surface of the first contact hole 167a to a first thickness d1.

A second work function control layer 171b may be conformally formed on an inner surface of a second contact hole 167b. The second work function control layer 171b may be formed on opposite lateral surfaces and a bottom surface of the second contact hole 167b to a second thickness d2. The first thickness d1 of the first work function control layer 170a and the second thickness d2 of the second work function control layer 171b may be different from each other. The thickness difference between the first work function control layer 170a and the second work function control layer 171b may be created by PVD, CVD or ILD or by an anisotropic etching process using a photo mask, but aspects of the present inventive concepts are not limited thereto.

The first work function control layer 170a and the second work function control layer 171b may include a high-k material. In detail, the first work function control layer 170a and the second work function control layer 171b may include the same material. For example, the first work function control layer 170a and the second work function control layer 171b may include one of Ti, TiN, HfO, Ga, and Ge, but aspects of the present inventive concepts are not limited thereto. In some embodiments of the present inventive concepts, the first work function control layer 170a and the second work function control layer 171b may include a material selected from the group consisting of HfO2, ZrO2, Ta2O5, TiO2, SrTiO3, BaTiO3, and SrTiO3.

The first contact 190a and the second contact 190b may have different work functions due to the thickness difference between the first work function control layer 170a and the second work function control layer 171b. Contact resistance between the first transistor 101a and the first contact 190a may be controlled by controlling the work function of the first contact 190a.

Accordingly, an operating work function of the first transistor 101a electrically connected to the first contact 190a may be controlled and operating characteristics of the first transistor 101a may be controlled. A work function of the second transistor 101b electrically connected to the second contact 190b may be controlled and operating characteristics of the second transistor 101b may be controlled. The first transistor 101a and the second transistor 101b may have different conductivity types. In the illustrated embodiment, a first region I may be, for example, a PFET region where a P-type transistor is formed, and a second region II may be, for example, an NFET region where an N-type transistor is formed. Here, the P-type transistor and the N-type transistor may have different work functions. Operating characteristics of the semiconductor device may be improved by adjusting a work function of a contact electrically connected to the P-type transistor and a work function of a contact electrically connected to the N-type transistor.

For example, the first transistor 101a and the second transistor 101b may be controlled to have the same threshold voltage using the first contact 190a and the second contact 190b having different work functions or may be controlled to operate with user's desired output, but aspects of the present inventive concepts are not limited thereto.

Figure 3:
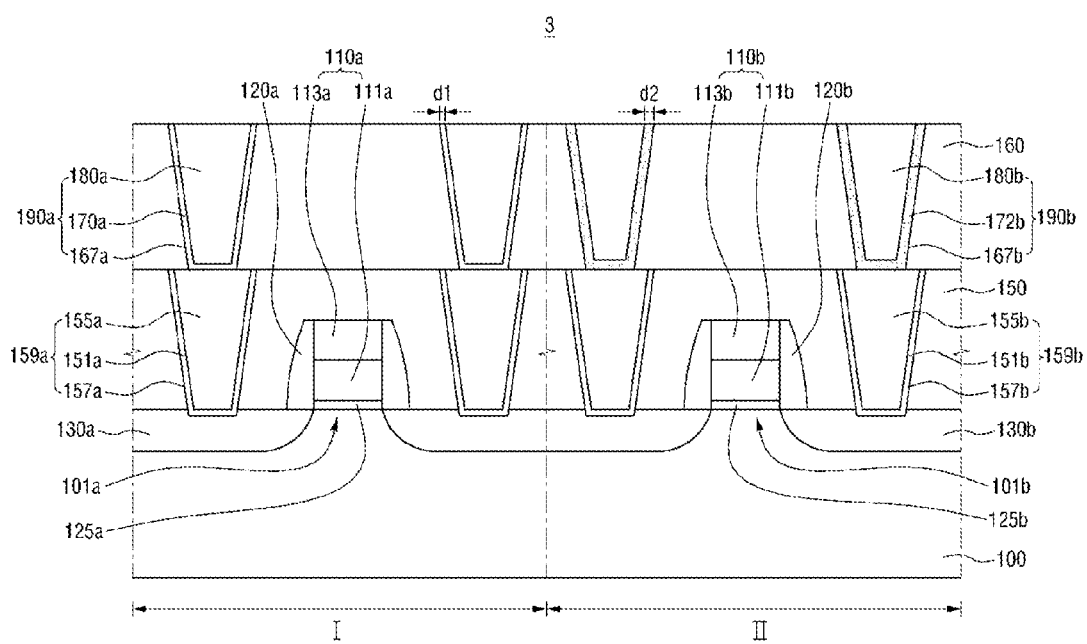
FIG. 3 illustrates a semiconductor device according to a third embodiment of the present inventive concepts.

FIG. 3 illustrates a semiconductor device according to a third embodiment of the present inventive concepts.

Referring to FIG. 3, the semiconductor device 3 according to the third embodiment of the present inventive concepts may be formed in substantially the same manner with the semiconductor device 1 shown in FIG. 1.

In the semiconductor device 3 according to the third embodiment of the present inventive concepts, a first work function control layer 170a may be conformally formed on an inner surface of a first contact hole 167a. The first work function control layer 170a may be formed on opposite lateral surfaces and a bottom surface of the first contact hole 167a to a first thickness d1.

A second work function control layer 172b may be conformally formed on an inner surface of the second contact hole 167b. The second work function control layer 172b may be formed on opposite lateral surfaces and a bottom surface of the second contact hole 167b to a second thickness d2. The first thickness d1 of the first work function control layer 170a and the second thickness d2 of the second work function control layer 172b may be different from each other.

The second work function control layer 172b may include a different material from the first work function control layer 170a and may include a material having a different concentration from the first work function control layer 170a. For example, the first work function control layer 170a and the second work function control layer 172b may be formed to different thicknesses and may include the same metal. Here, a concentration of the metal included in the first work function control layer 170a and a concentration of the metal included in the second work function control layer 172b may be different from each other. In some embodiments of the present inventive concepts, since the first work function control layer 170a and the second work function control layer 172b include different materials, so that they have different work functions.

The first contact 190a and the second contact 190b may have different work functions due to differences in the thickness, the constituent material and the concentration of the constituent material between the first work function control layer 170a and the second work function control layer 172b. Contact resistance between the first contact plug 159a and the first contact 190a may be controlled by controlling the work function of the first contact 190a. Accordingly, an operating work function of the first transistor 101a electrically connected to the first contact 190a may be controlled and operating characteristics of the first transistor 101a may be controlled. A work function of the second transistor 101b electrically connected to the second contact 190b may be controlled and operating characteristics of the second transistor 101b may be controlled.

Figure 4:
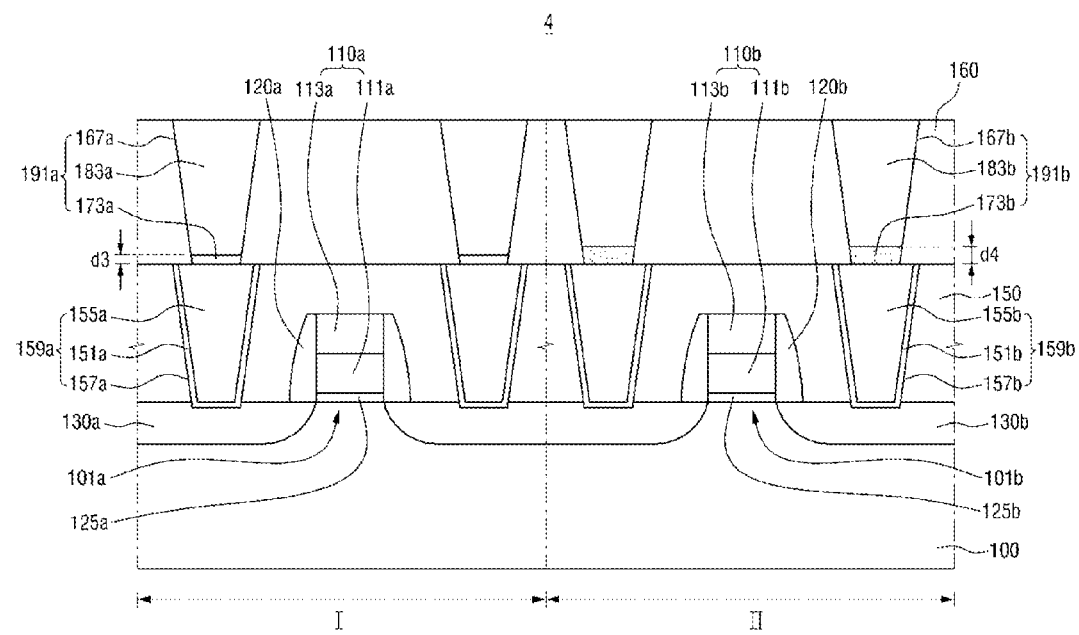
FIG. 4 illustrates a semiconductor device according to a fourth embodiment of the present inventive concepts.

FIG. 4 illustrates a semiconductor device according to a fourth embodiment of the present inventive concepts.

Referring to FIG. 4, the semiconductor device 4 according to the fourth embodiment of the present inventive concepts may be formed in substantially the same manner with the semiconductor device 1 shown in FIG. 1.

In the semiconductor device 4 according to the fourth embodiment of the present inventive concepts, a first work function control layer 173a may be formed only under a first contact 191a. The first work function control layer 173a may be formed on a first contact plug 159a exposed by a first contact hole 167a to a third thickness d3. A third conductive layer 183a may be disposed on the first work function control layer 173a and may be formed to fill the first contact hole 167a.

A second work function control layer 173b may be formed only under a second contact 191b. The second work function control layer 173b may be formed on a second contact plug 159b exposed by a second contact hole 167b to a fourth thickness d4. A fourth conductive layer 183b may be disposed on the second work function control layer 173b and may be formed to fill the second contact hole 167b.

The third thickness d3 of the first work function control layer 173a and the fourth thickness d4 of the second work function control layer 173b may be different from each other.

The second work function control layer 173b may include a different material from the first work function control layer 173a and may include a material having a different concentration from the first work function control layer 173a. For example, the first work function control layer 173a and the second work function control layer 173b may be formed to the same thickness and may include the same metal. Here, a concentration of the metal included in the first work function control layer 173a and a concentration of the metal included in the second work function control layer 173b may be different from each other. In some embodiments of the present inventive concepts, since the first work function control layer 173a and the second work function control layer 173b include different materials, so that they have different work functions.

The first contact 191a and the second contact 191b may have different work functions due to differences in the thickness, the constituent material and the concentration of the constituent material between the first work function control layer 173a and the second work function control layer 173b. Contact resistance between the first transistor 101a and the first contact 191a may be controlled by controlling the work function of the first contact 191a. Accordingly, an operating work function of the first transistor 101a electrically connected to the first contact 191a may be controlled and operating characteristics of the first transistor 101a may be controlled. A work function of the second transistor 101b electrically connected to the second contact 191b may be controlled and operating characteristics of the second transistor 101b may be controlled.

Figure 5:
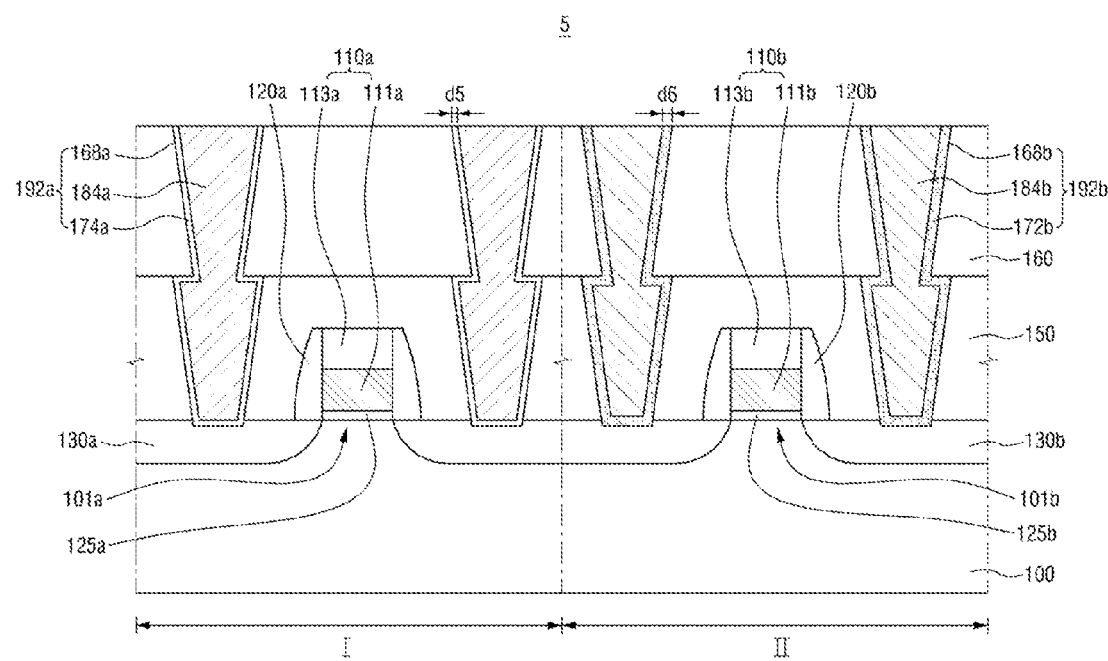
FIG. 5 illustrates a semiconductor device according to a fifth embodiment of the present inventive concepts.

FIG. 5 illustrates a semiconductor device according to a fifth embodiment of the present inventive concepts.

Referring to FIG. 5, in the semiconductor device 5 according to the fifth embodiment of the present inventive concepts, a contact plug and a contact are integrally formed.

Interlayer insulation layers 150 and 160 may include a first interlayer insulation layer 150 and a second interlayer insulation layer 160. The interlayer insulation layers 150 and 160 may be formed on a semiconductor substrate 100 and may be formed to cover first and second transistors 101a and 101b. The following description will be made with regard to the first transistor 101a by way of example.

A first contact 192a may be formed on the first transistor 101a. The first contact 192a may include a first contact hole 168a, a first work function control layer 174a, and a first conductive layer 184a.

The first contact hole 168a may be formed to pass through the first interlayer insulation layer 150 and the second interlayer insulation layer 160. The first contact hole 168a may be formed on the first transistor 101a and may expose a portion of the first transistor 101a. For example, the first contact hole 168a may expose a source or drain 130a of the first transistor 101a.

The first contact hole 168a may be tapered. That is to say, the first contact hole 168a may have a double-layered trapezoidal shape or a double-layered inverted trapezoidal shape, but aspects of the present inventive concepts are not limited thereto. The first contact hole 168a may have a rectangular shape.

The first work function control layer 174a may be conformally formed on an inner surface of the first contact hole 168a. The first work function control layer 174a may be formed on opposite lateral surfaces and a bottom surface of a first contact hole 168a to a fifth thickness d5. The first conductive layer 184a may be disposed on the first work function control layer 174a and may be formed to fill the first contact hole 168a.

A second contact 192b may be formed on the second transistor 101b. The second contact 192b may include a second contact hole 168b, a second work function control layer 174b and a second conductive layer 184b.

The second contact hole 168b may be formed to pass through the first interlayer insulation layer 150 and the second interlayer insulation layer 160. The second contact hole 168b may be disposed on the second transistor 101b and may expose a portion of the second transistor 101b. For example, the second contact hole 168b may expose a source or drain 130b of the second transistor 101b.

The second work function control layer 174b may be conformally formed on an inner surface of the second contact hole 168b. That is to say, the second work function control layer 174b may be formed on opposite lateral surfaces and a bottom surface of the second contact hole 168b to a sixth thickness d6. The second conductive layer 184b may be disposed on the second work function control layer 174b and may be formed to fill the second contact hole 168b.

The fifth thickness d5 of the first work function control layer 174a and the sixth d6 of the second work function control layer 174b may be different from each other.

The second work function control layer 174b may include a different material from the first work function control layer 174a or may include a material having a different concentration from the first work function control layer 174a. For example, the first work function control layer 174a and the second work function control layer 174b may be formed to different thicknesses and may include the same metal. Here, a concentration of the metal included in the first work function control layer 174a and a concentration of the metal included in the second work function control layer 174b may be different from each other. In some embodiments of the present inventive concepts, since the first work function control layer 174a and the second work function control layer 174b include different materials, so that they have different work functions.

The first contact 192a and the second contact 192b may have different work functions due to differences in the thickness, the constituent material and the concentration of the constituent material between the first work function control layer 174a and the second work function control layer 174b. Contact resistance between the first transistor 101a and the first contact 192a may be controlled by controlling the work function of the first contact 192a. Accordingly, an operating work function of the first transistor 101a electrically connected to the first contact 192a may be controlled and operating characteristics of the first transistor 101a may be controlled. A work function of the second transistor 101b electrically connected to the second contact 192b may be controlled and operating characteristics of the second transistor 101b may be controlled.

Figure 6:
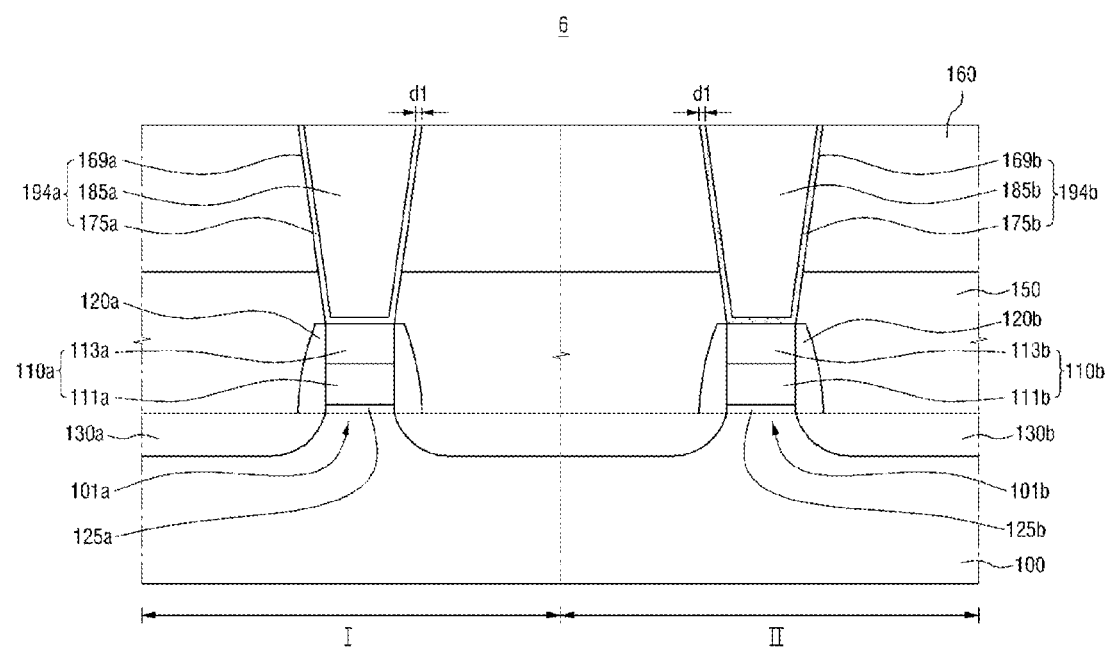
FIG. 6 illustrates a semiconductor device according to a sixth embodiment of the present inventive concepts.

FIG. 6 illustrates a semiconductor device according to a sixth embodiment of the present inventive concepts.

Referring to FIG. 6, in the semiconductor device 6 according to the sixth embodiment of the present inventive concepts, a first contact 195a may be formed on a first gate electrode 110a of a first transistor 101a. A bottom surface of the first contact 195a may contact the first gate electrode 110a or may be electrically connected to the first gate electrode 110a.

Interlayer insulation layers 150 and 160 may include a first interlayer insulation layer 150 and a second interlayer insulation layer 160. The interlayer insulation layers 150 and 160 may be formed on a semiconductor substrate 100 and may be formed to cover first and second transistors 101a and 101b.

A first contact 195a may be formed on the first transistor 101a. The first contact 195a may include a first contact hole 169a, a first work function control layer 175a, and a first conductive layer 185a.

The first contact hole 169a may be formed to pass through the first interlayer insulation layer 150 and the second interlayer insulation layer 160. The first contact hole 169a may be formed on the first transistor 101a and may expose a portion of the first transistor 101a. For example, the first contact hole 169a may expose a gate electrode 110a of the first transistor 101a.

The first contact hole 169a may be tapered. The first contact hole 169a may have a trapezoidal shape or an inverted trapezoidal shape, but aspects of the present inventive concepts are not limited thereto. The first contact hole 169a may have a rectangular shape.

The first work function control layer 175a may be conformally formed on an inner surface of the first contact hole 169a. That is to say, the first work function control layer 175a may be formed on opposite lateral surfaces and a bottom surface of the first contact hole 169a to a first thickness d1. The first conductive layer 185a may be disposed on the first work function control layer 175a and may be formed to fill the first contact hole 169a.

A second contact 195b may be formed on the second transistor 101b. The second contact 195b may include a second contact hole 169b, a second work function control layer 175b, and a second conductive layer 185b.

The second contact hole 169b may be formed to pass through the first interlayer insulation layer 150 and the second interlayer insulation layer 160. The second contact hole 169b may be formed on the second transistor 101b and may expose a portion of the second transistor 101b. For example, the second contact hole 169b may expose a gate electrode 110b of the second transistor 101b.

The second work function control layer 175b may be conformally formed on an inner surface of the second contact hole 169b. That is to say, the second work function control layer 175b may be formed on opposite lateral surfaces and a bottom surface of the second contact hole 169b to a first thickness d1. The second conductive layer 185b may be disposed on the second work function control layer 175b and may be formed to fill the second contact hole 169b.

The first work function control layer 175a and the second work function control layer 175b may have the same thickness.

The second work function control layer 175b may include a different material from the first work function control layer 175a and may include a material having a different concentration from the first work function control layer 175a. For example, the first work function control layer 175a and the second work function control layer 175b may be formed to the same thickness and may include the same metal. A concentration of the metal included in the first work function control layer 175a may be different from a concentration of the metal included in the second work function control layer 175b. In some embodiments of the present inventive concepts, the first work function control layer 175a and the second work function control layer 175b may include different materials, so that they have different work functions.

The first contact 195a and the second contact 195b may have different work functions due to differences in the thickness, the constituent material and the concentration of the constituent material between the first work function control layer 175a and the second work function control layer 175b. Contact resistance between the gate electrode 110a of the first transistor 101a and the first contact 195a may be controlled by controlling the work function of the first contact 195a. Accordingly, an operating work function of the first transistor 101a electrically connected to the first contact 195a may be controlled and operating characteristics of the first transistor 101a may be controlled. A work function of the second transistor 101b electrically connected to the second contact 195b may be controlled and operating characteristics of the second transistor 101b may be controlled.

The first transistor 101a and the second transistor 101b may have different conductivity types. In the illustrated embodiment, a first region I may be, for example, a PFET region where a P-type transistor is formed, and a second region II may be, for example, an NFET region where an N-type transistor is formed. Here, the P-type transistor and the N-type transistor may have different conductivity types. Operating characteristics of a semiconductor device may be improved by adjusting a work function of a contact electrically connected to the P-type transistor and a work function of a contact electrically connected to the N-type transistor. For example, the first transistor 101a and the second transistor 101b may be controlled to have the same threshold voltage using the first contact 195a and the second contact 195b having different work functions or may be controlled to operate with user's desired output, but aspects of the present inventive concepts are not limited thereto.

Figure 7:
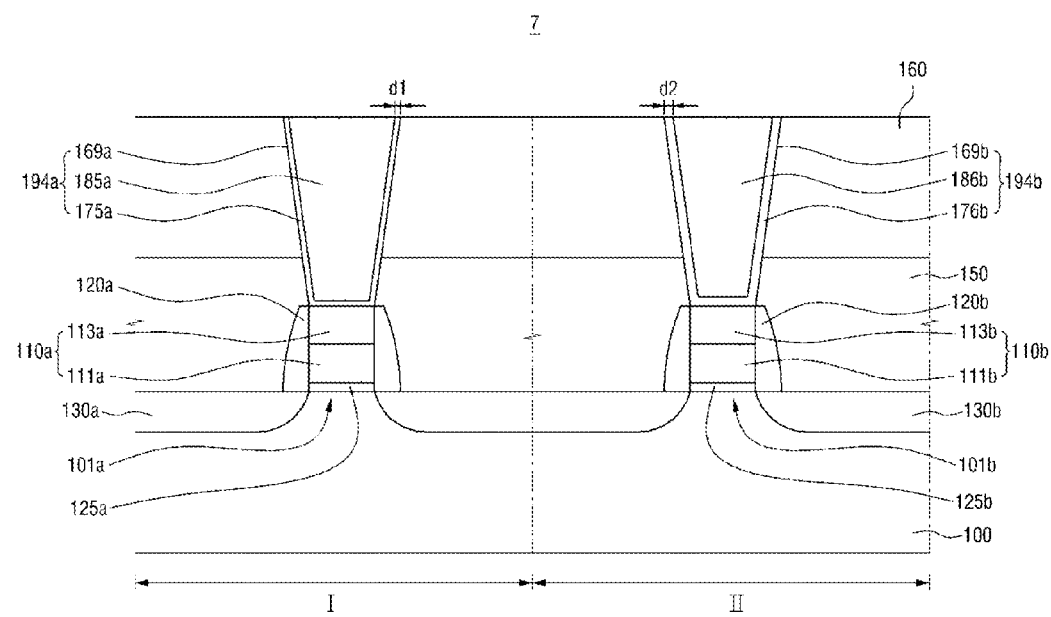
FIG. 7 illustrates a semiconductor device according to a seventh embodiment of the present inventive concepts.

FIG. 7 illustrates a semiconductor device according to a seventh embodiment of the present inventive concepts.

Referring to FIG. 7, the semiconductor device 7 according to the seventh embodiment of the present inventive concepts may be formed in substantially the same manner with the semiconductor device 6 shown in FIG. 6.

In the semiconductor device 7 according to the seventh embodiment of the present inventive concepts, a first work function control layer 176a may be conformally formed on an inner surface of a first contact hole 169a. The first work function control layer 176a may be formed on opposite lateral surfaces and a bottom surface of the first contact hole 169a to a first thickness d1.

A second work function control layer 176b may be conformally formed on an inner surface of a second contact hole 169b. The second work function control layer 176b may be formed on opposite lateral surfaces and a bottom surface of the second contact hole 169b to a second thickness d2.

The first thickness d1 of the first work function control layer 176a and the second thickness d2 of the second work function control layer 176b may be different from each other. The thickness difference between the first work function control layer 176a and the second work function control layer 176b may be created by PVD, CVD or ILD or by anisotropical etching using a photo mask, but aspects of the present inventive concepts are not limited thereto.

The first work function control layer 176a and the second work function control layer 176b may include a high-k material. In detail, the first work function control layer 176a and the second work function control layer 176b may include the same material. For example, the first work function control layer 176a and the second work function control layer 176b may include one of Ti, TiN, HfO, Ga, and Ge, but aspects of the present inventive concepts are not limited thereto. In some embodiments of the present inventive concepts, the first work function control layer 176a and the second work function control layer 176b may include a material selected from the group consisting of HfO2, ZrO2, Ta2O5, TiO2, SrTiO3, BaTiO3, and SrTiO3.

The first contact 195a and the second contact 195b may have different work functions due to the thickness difference between the first work function control layer 176a and the second work function control layer 176b. Contact resistance between the gate electrode 110a of the first transistor 101a and the first contact 195a may be controlled by controlling the work function of the first contact 195a. Accordingly, an operating work function of the first transistor 101a electrically connected to the first contact 195a may be controlled and operating characteristics of the first transistor 101a may be controlled. A work function of the second transistor 101b electrically connected to the second contact 195b may be controlled and operating characteristics of the second transistor 101b may be controlled.

Figure 8:
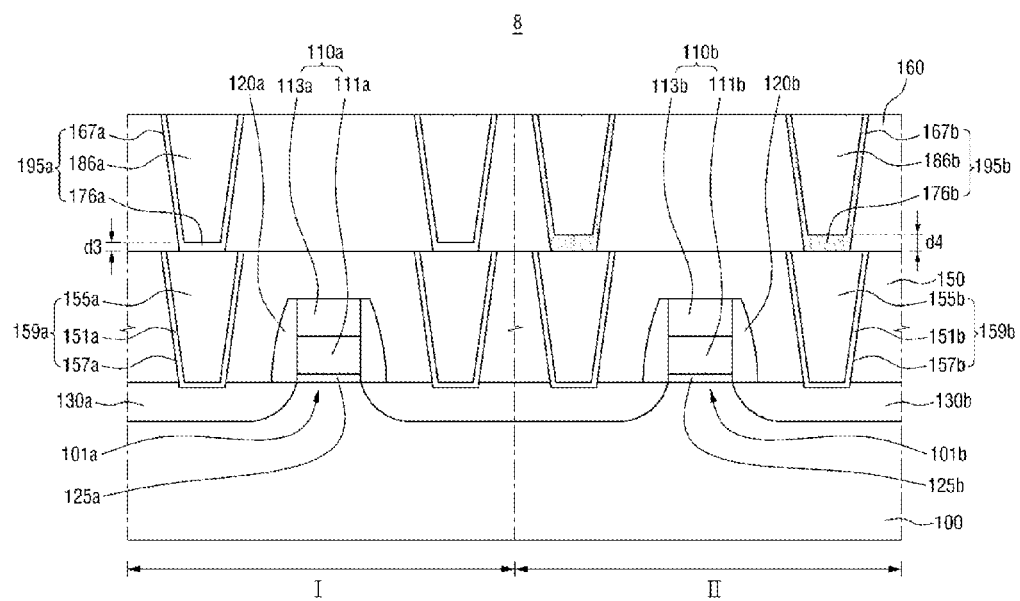
FIG. 8 illustrates a semiconductor device according to an eighth embodiment of the present inventive concepts.

FIG. 8 illustrates a semiconductor device according to an eighth embodiment of the present inventive concepts.

Referring to FIG. 8, the semiconductor device 8 according to the eighth embodiment of the present inventive concepts may be formed in substantially the same manner with the semiconductor device 4 shown in FIG. 4.

In the semiconductor device 8 according to the eighth embodiment of the present inventive concepts, a first work function control layer 176a may be formed on opposite sidewalls and a bottom surface of a first contact 195a. In detail, the first work function control layer 176a may be conformally formed on sidewalls of the first contact 195a. The first work function control layer 176a may be formed under the first contact 195a to a third thickness d3. The third thickness d3 of the first work function control layer 176a may be greater than a thickness of a sidewall of the first work function control layer 176a, but aspects of the present inventive concepts are not limited thereto. A third conductive layer 186a may be disposed on the first work function control layer 176a and may be formed to fill the first contact hole 167a.

The second work function control layer 176b may be formed on lateral surfaces and a bottom surface of the second contact 195b. The second work function control layer 176b may be conformally formed on sidewalls of the second contact 195b. The second work function control layer 176b may be formed under the second contact hole 167b to a fourth thickness d4. The fourth thickness d4 of the second work function control layer 176b may be greater than a thickness of a sidewall of the second work function control layer 176b. A fourth conductive layer 186b may be disposed on the second work function control layer 176b and may be formed to fill the second contact hole 167b.

The third thickness d3 of the first work function control layer 176a and the fourth thickness d4 of the second work function control layer 176b may be different from each other.

The second work function control layer 176b may include a different material from the first work function control layer 176a and may include a material having a different concentration from the first work function control layer 176a. For example, the first work function control layer 176a and the second work function control layer 176b may include the same metal. Here, a concentration of the metal included in the first work function control layer 176a may be different from a concentration of the metal included in the second work function control layer 176b. In some embodiments of the present inventive concepts, the first work function control layer 176a and the second work function control layer 176b include different materials, so that they have different work functions.

The first contact 195a and the second contact 195b may have different work functions due to differences in the thickness, the constituent material and the concentration of the constituent material between the first work function control layer 176a and the second work function control layer 176b. Contact resistance between the first transistor 101a and the first contact 195a may be controlled by controlling the work function of the first contact 195a. Accordingly, an operating work function of the first transistor 101a electrically connected to the first contact 195a may be controlled and operating characteristics of the first transistor 101a may be controlled. Likewise, a work function of the second transistor 101b electrically connected to the second contact 195b may be controlled and operating characteristics of the second transistor 101b may be controlled.

Figure 9:
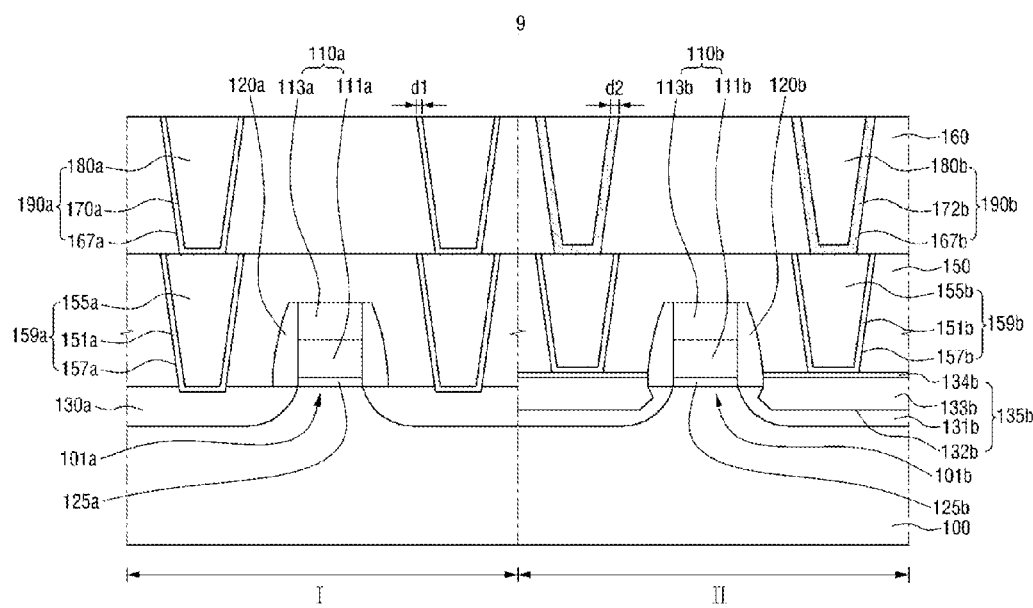
FIG. 9 illustrates a semiconductor device according to a ninth embodiment of the present inventive concepts.

FIG. 9 illustrates a semiconductor device according to a ninth embodiment of the present inventive concepts.

Referring to FIG. 9, the semiconductor device 9 according to the ninth embodiment of the present inventive concepts may be formed in substantially the same manner with the semiconductor device 3 shown in FIG. 3.

A second transistor 101b of the semiconductor device 9 may include an elevated source or drain 135b. The elevated source or drain 135b may be formed on either side of the second gate electrode 110b. A top portion of the elevated source or drain 135b may contact lateral surfaces of a spacer 120b.

The elevated source or drain 135b may include a trench 132b. The trench 132b may be formed in a doping region 131b and a bottom surface of the trench 132b may be positioned to be lower than a bottom surface of a second gate electrode 110b. A portion of the trench 132b may be positioned at a lower portion of the spacer 120b, but aspects of the present inventive concepts are not limited thereto.

An epitaxial layer 133b may improve operating characteristics of the second transistor 101b. For example, when the second transistor 101b is an NMOS transistor, the epitaxial layer 133b may include a material for applying tensile stress to a channel, for example, SiC. When the second transistor 101b is a PMOS transistor, the epitaxial layer 133b may include a material for applying compressive stress to a channel, for example, SiGe. The epitaxial layer 133b may be formed on the doping region 131b in the trench 132b. A top surface of the epitaxial layer 133b may be formed to be higher than a bottom surface of the second gate electrode 110b.

A metal alloy layer 134b may be formed on the epitaxial layer 133b. The metal alloy layer 134b may not be formed on the second gate electrode 110b. The metal alloy layer 134b may include, for example, silicide. The metal alloy layer 134b may be completed by forming a metal layer on the elevated source or drain 135b by plating, followed by annealing to allow the elevated source or drain 135b to react with the metal layer, thereby forming silicide. Since the plating is employed, the metal alloy layer 134b may be formed, irrespective of the shape of the elevated source or drain 135b. According to the kind of the metal layer, electroless plating or electro-plating may be employed.

The metal alloy layer 134b may be positioned under the second contact plug 159b and may be formed to contact a bottom surface of a second contact plug 159b. The metal alloy layer 134b may improve electron mobility between the second contact plug 159b and the epitaxial layer 133b, but aspects of the present inventive concepts are not limited thereto. The metal alloy layer 134b may not be provided.

Figure 10:
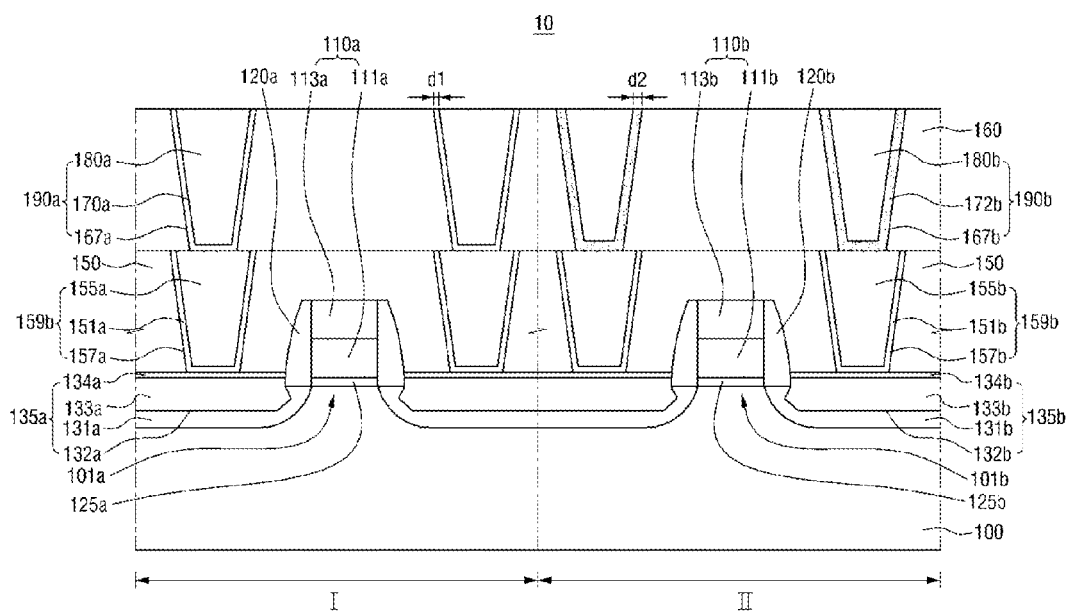
FIG. 10 illustrates a semiconductor device according to a tenth embodiment of the present inventive concepts.

FIG. 10 illustrates a semiconductor device according to a tenth embodiment of the present inventive concepts.

Referring to FIG. 10, the semiconductor device 10 according to the tenth embodiment of the present inventive concepts may be formed in substantially the same manner with the semiconductor device 9 shown in FIG. 9.

Here, a first transistor 101a of the semiconductor device 10 may include an elevated source or drain 135a. The elevated source or drain 135a may include a trench 132a, an epitaxial layer 133a and a metal alloy layer 134a. The elevated source or drain 135a of the first transistor 101a may be formed in substantially the same manner with the elevated source or drain 135b of the second transistor 101b shown in FIG. 9.

The first transistor 101a and the second transistor 101b may have different conductivity types. A first region I may be, for example, a PFET region where a P-type transistor is formed, and a second region II may be, for example, an NFET region where an N-type transistor is formed. Accordingly, an epitaxial layer 133a of the first transistor 101a may include a material for applying compressive stress to a channel, for example, SiGe and the epitaxial layer 133a of the second transistor 101b may include a material for applying tensile stress to a channel, for example, SiC.

Figure 11:
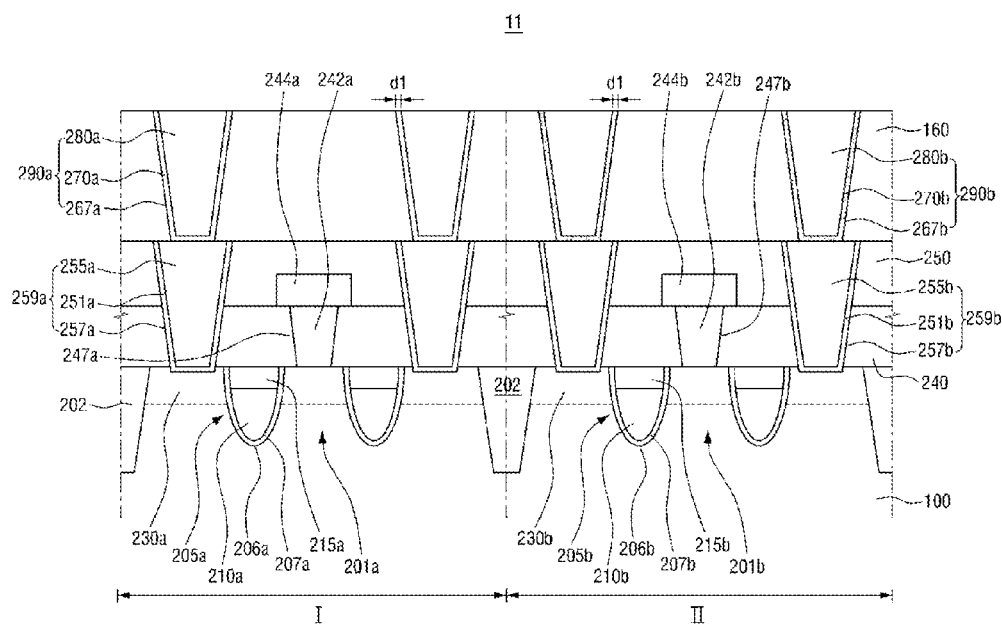
FIG. 11 illustrates a semiconductor device according to an eleventh embodiment of the present inventive concepts.

FIG. 11 illustrates a semiconductor device according to an eleventh embodiment of the present inventive concepts.

Referring to FIG. 11, the semiconductor device 11 according to the eleventh embodiment of the present inventive concepts includes a substrate 100, an isolation layer 202, a first transistor 201a, a second transistor 201b, a first contact plug 259a, a second contact plug 259b, a first contact 290a, a second contact 290b, interlayer insulation layers 240, 250 and 260. The first and second transistors 201a and 201b may include BCAT transistors, which will now be described with regard to the first transistor 201a by way of example.

The isolation layer 202 is formed in a substrate 100 to define unit active regions (not shown). The isolation layer 202 may have a shallow trench isolation (STI) structure demonstrating an excellent isolation characteristic and occupying a reduced area, which are advantageous for achieving high integration, but aspects of the present inventive concepts are not limited thereto. The isolation layer 202 may include, for example, at least one of silicon oxide, silicon nitride, silicon oxynitride and combinations thereof.

The first transistor 201a includes gate structures 205a and a source or drain 230a. Each of the gate structures 205a may include a trench 206a, a gate insulation layer 207a, a gate electrode 210a and a capping layer 215a.

The trench 206a may be formed in the substrate 100. The trench 206a may have various shapes. For example, the trench 206a may be shaped to have a round connection part between a bottom surface and sidewalls thereof. Alternatively, the trench 206a may have the sidewalls inclined at a desired (or, alternatively a predetermined) angle.

The gate insulation layer 207a may be conformally formed along the trench 206a. The gate insulation layer 207a may include, for example, silicon oxide, silicon nitride, silicon oxynitride or a high-k material. The high-k material may include, for example, one or more selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but aspects of the present inventive concepts are not limited thereto.

The gate electrode 210a may be formed by filling at least a portion of the trench 206a having the gate insulation layer 207a. The gate electrode 210a may be recessed. That is to say, a top surface of the gate electrode 210a may be lower than a (top) surface of the substrate 100. The gate electrode 210a may include a conductive material including, for example, a metal and polysilicon, but aspects of the present inventive concepts are not limited thereto.

The capping layer 215a may be formed by filling the remaining portion of the trench 206a having the gate electrode 210a. The capping layer 215a may include, for example, at least one of silicon oxide, silicon nitride and silicon oxynitride.

The source or drain 230a may be formed between the gate structures 205a or between the gate structure 205a and the isolation layer 202.

The first contact plug 259a may include a first trench 257a, a first barrier metal 251a, and a first conductive layer 255a. Likewise, the second contact plug 259b may include a second trench 257b, a second barrier metal 251b and a second conductive layer 255b.

The first contact 290a may be formed on the first contact plug 259a. The first contact 290a may include a first contact hole 267a, a first work function control layer 270a and a third conductive layer 280a. The second contact 290b may be formed on the second contact plug 259b. The second contact 290b may include a second contact hole 267a, a second work function control layer 270b and a fourth conductive layer 280b.

The first and second contact plugs 259a and 259b and the first and second contacts 290a and 290b may be formed in substantially the same manner with the first and second contact plugs 159a and 159b and the first and second contacts 190a and 190b of the semiconductor device 1 shown in FIG. 1. The first work function control layer 270a and the second work function control layer 270b may have the same thickness (i.e., d1). The second work function control layer 270b may include a different material from the first work function control layer 270a and may include a material having a different concentration from the first work function control layer 270a.

The contact plug 259a electrically connected to the source or drain 230a is illustrated in FIG. 11, but aspects of the present inventive concepts are not limited thereto. The contact plug 259a may also be formed on the gate electrode 205a in the same configuration and process. Accordingly, the first and second contacts 290a and 290b may be electrically connected to the gate electrode 205a, but aspects of the present inventive concepts are not limited thereto.

Figure 12:
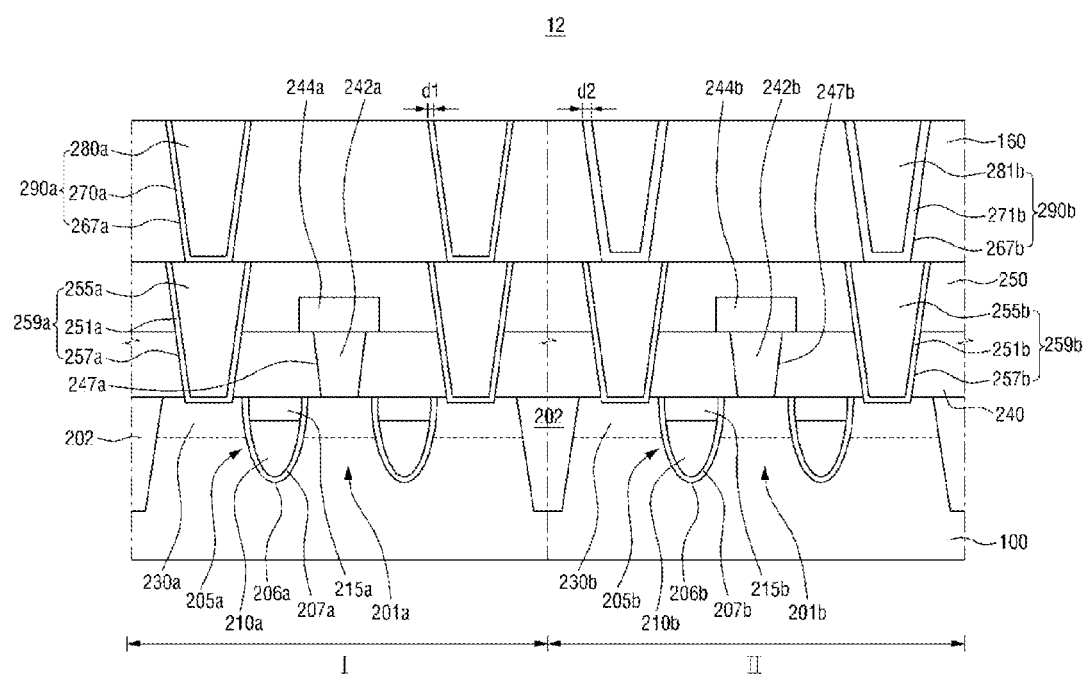
FIG. 12 illustrates a semiconductor device according to a twelfth embodiment of the present inventive concepts.

FIG. 12 illustrates a semiconductor device according to a twelfth embodiment of the present inventive concepts.

Referring to FIG. 12, the semiconductor device 12 according to the twelfth embodiment of the present inventive concepts may be formed in substantially the same manner with the semiconductor device 11 shown in FIG. 11.

The first and second contact plugs 259a and 259b and the first and second contacts 290a and 290b may be formed in substantially the same manner with the first and second contact plugs 159a and 159b and the first and second contacts 190a and 190b of the semiconductor device 2 shown in FIG. 2. That is to say, the first work function control layer 270a and the second work function control layer 271b may include the same material. Further, since the first work function control layer 270a and the second work function control layer 271b have different thicknesses, the first contact 290a and the second contact 290b may have different work functions.

Figure 13:
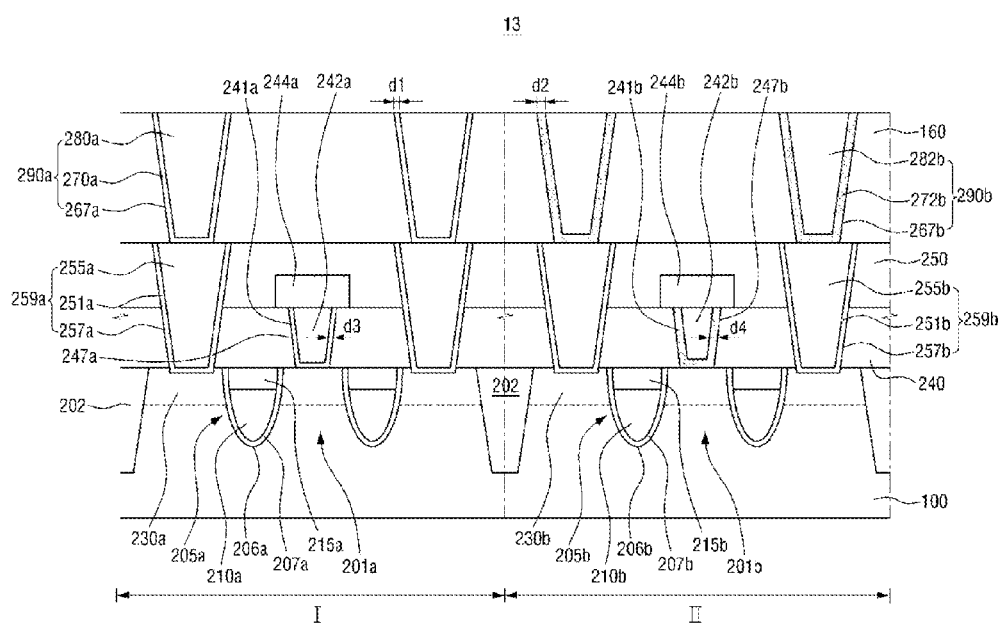
FIG. 13 illustrates a semiconductor device according to a thirteenth embodiment of the present inventive concepts.

FIG. 13 illustrates a semiconductor device according to a thirteenth embodiment of the present inventive concepts.

Referring to FIG. 13, the semiconductor device 13 according to the thirteenth embodiment of the present inventive concepts may be formed in substantially the same manner with the semiconductor device 11 shown in FIG. 11.

The first and second contact plugs 259a and 259b and the first and second contacts 290a and 290b may be formed in substantially the same manner with the first and second contact plugs 159a and 159b and the first and second contacts 190a and 190b of the semiconductor device 3 shown in FIG. 3. The first thickness d1 of the first work function control layer 270a and the second thickness d2 the second work function control layer 272b may be different from each other. Further, the second work function control layer 272b may have a different material from the first work function control layer 270a or may include a material having a different concentration from the first work function control layer 270a.

In an embodiment, bit line contact holes may be disposed on a channel formed between a plurality of gate structures 205a and 205b. The bit line contact holes 247a and 247b may be formed in a first interlayer insulation layer 240.

The bit line contact holes may include a first bit line contact hole 247a disposed on a first transistor 201a and a second bit line contact hole 247b disposed on a second transistor 201b.

A third work function control layer 241a may be formed on opposite lateral surfaces and a bottom surface of the first bit line contact hole 247a to a third thickness d3. In addition, a third conductive layer 242a may be formed on the third work function control layer 241a.

A fourth work function control layer 241b may be formed on opposite lateral surfaces and a bottom surface of the second bit line contact hole 247b to a fourth thickness d4. A fourth conductive layer 242b may be formed on the fourth work function control layer 241b.

Like the aforementioned work function control layers, the third work function control layer 241a and the fourth work function control layer 241b may be formed to different thicknesses, may include different materials or may include the same metal with different concentrations.

Figure 14:
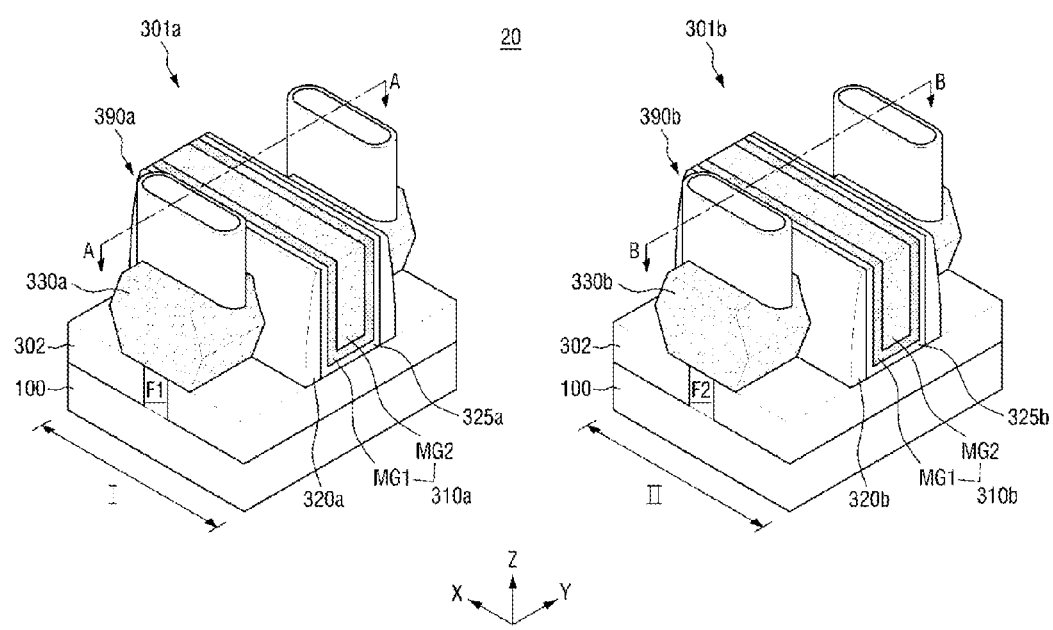
FIG. 14 is a perspective view illustrating a semiconductor device according to a fourteenth embodiment of the present inventive concepts.

FIG. 14 is a perspective view illustrating a semiconductor device according to a fourteenth embodiment of the present inventive concepts.

Referring to FIG. 14, the semiconductor device 20 may include a substrate 100, first and second fins F1 and F2, gate electrodes 310a and 310b, elevated sources or drains 330a and 330b, contacts 390a and 390b, and an isolation layer 302. In detail, the semiconductor device 20 may have a multi-gate structure including, for example, a FinFET structure, a gate all around (GAA) structure, or so on.

The substrate 100 may include one or more semiconductor materials selected from the group consisting of Si, Ge, SiGe, GaP, GaAs, SiC, SiGeC, InAs and InP. Alternatively, in some embodiments of the present inventive concepts, the substrate 100 may also be a silicon on insulator (SOI) substrate. Although not clearly shown, a first active region and a second active region may be defined on the substrate 100.

The substrate 100 may include a first region I and a second region II. A first transistor 301a may be formed in the first region I of the substrate 100 and a second transistor 301b may be formed in the second region II of the substrate 100. The first transistor 301a and the second transistor 301b may have different conductivity types. The first transistor 301a and the second transistor 301b may be formed in substantially the same manner. The following description will be made with regard to the first transistor 301a by way of example.

The first fin F1 may extend lengthwise in a second direction Y. The first fin F1 may be a portion of the substrate 100 or may include an epitaxial layer grown from the substrate 100. An isolation layer 302 may cover lateral surfaces of the first fin F1. A first active region may include the first fin F1.

The gate electrode 310a may be formed on the first fin F1 to cross the first fin F1. The gate electrode 310a may extend in the X-axis direction.

The gate electrode 310a may include metal layers MG1 and MG2. As shown, the gate electrode 310a may be formed by stacking two or more metal layers MG1 and MG2. The first metal layer MG1 may function to adjust a work function, and the second metal layer MG2 may function to fill a space formed by the first metal layer MG1. For example, the first metal layer MG1 may include at least one of TiN, TaN, TiC and TaC. In addition, the second metal layer MG2 may include W or Al. Alternatively, the gate electrode 310a may be made of a non-metal material, such as Si, or SiGe. The gate electrode 310a may be formed by, for example, a replacement process, but aspects of the present inventive concepts are not limited thereto.

The gate insulation layer 325a may be formed between each of the first and second fins F1 and F2 and the gate electrode 310a. The gate insulation layer 325a may be formed on top surfaces and top portions of lateral surfaces of the first and second fins F1 and F2. In addition, the gate insulation layer 325a may be disposed between the gate electrode 310a and the isolation layer 302. The gate insulation layer 325a may include a high-k material having a higher dielectric constant than silicon oxide. The gate insulation layer 325a may include, for example, HfO2, ZrO2 or Ta2O5.

The spacer 320a may include at least one of a nitride layer and an oxynitride layer.

The elevated source or drain 330a may be formed on the first and second fins F1 and F2 at opposite sides of the gate electrode 310a. The elevated source or drain 330a may contact the spacer 320a and lateral surfaces of the first and second fins F1 and F2.

The elevated source or drain 330a may have various shapes. For example, the elevated source or drain 330a may have at least one shape of a diamond, a circle and a rectangle.

When the first transistor 301a according to an embodiment of the present inventive concepts is a PMOS transistor, the elevated source or drain 330a may include a compressive stress material. For example, the compressive stress material may be a material having a larger lattice constant than silicon (Si), for example, SiGe.

The compressive stress material may improve the mobility of carriers of a channel region by applying compressive stress to the first and second fins F1 and F2.

However, when the first transistor 301a is an NMOS transistor, the elevated source or drain 330a may include the same material as the substrate 100 or a tensile stress material. For example, when the substrate 100 includes Si, the elevated source or drain 330a may include Si or a material having a smaller lattice constant than Si (e.g., SiC).

The contact 390a electrically connects a wire and the elevated source or drain 330a. As the contact 390a, for example, Al, Cu, or W may be used, but aspects of the present inventive concepts are not limited thereto. The contact 390a may be formed to pass through a second interlayer insulation layer 350 and a third interlayer insulation layer 360, but aspects of the present inventive concepts are not limited thereto. Although not clearly shown, the contact 390a may be connected to the elevated source or drain 330a or the gate electrode 310a, which will later be described in detail with reference to FIGS. 15 to 17.

Figure 15:
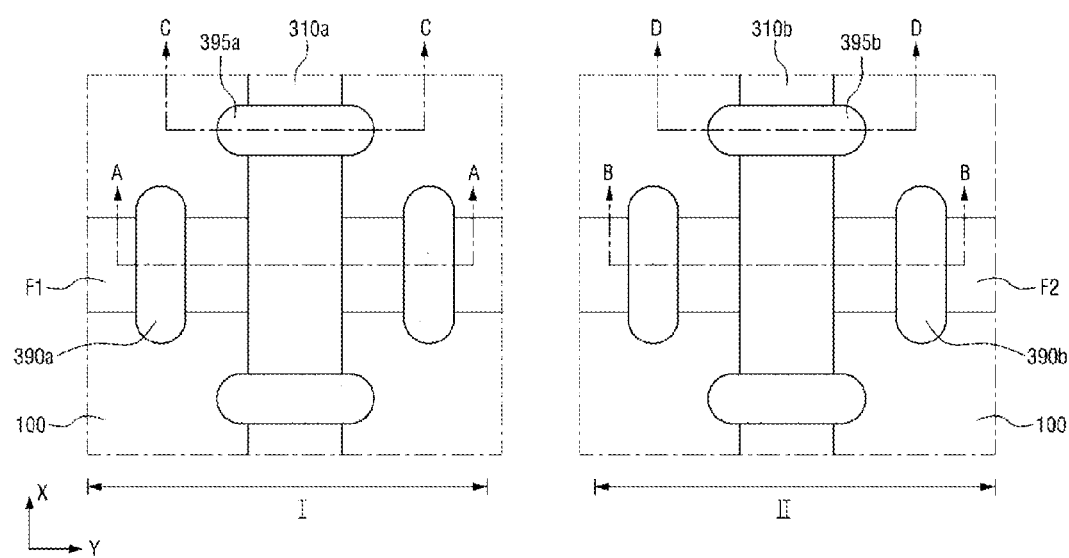
FIG. 15 is a layout view illustrating a semiconductor device according to a fifteenth embodiment of the present inventive concepts.
Figure 16:
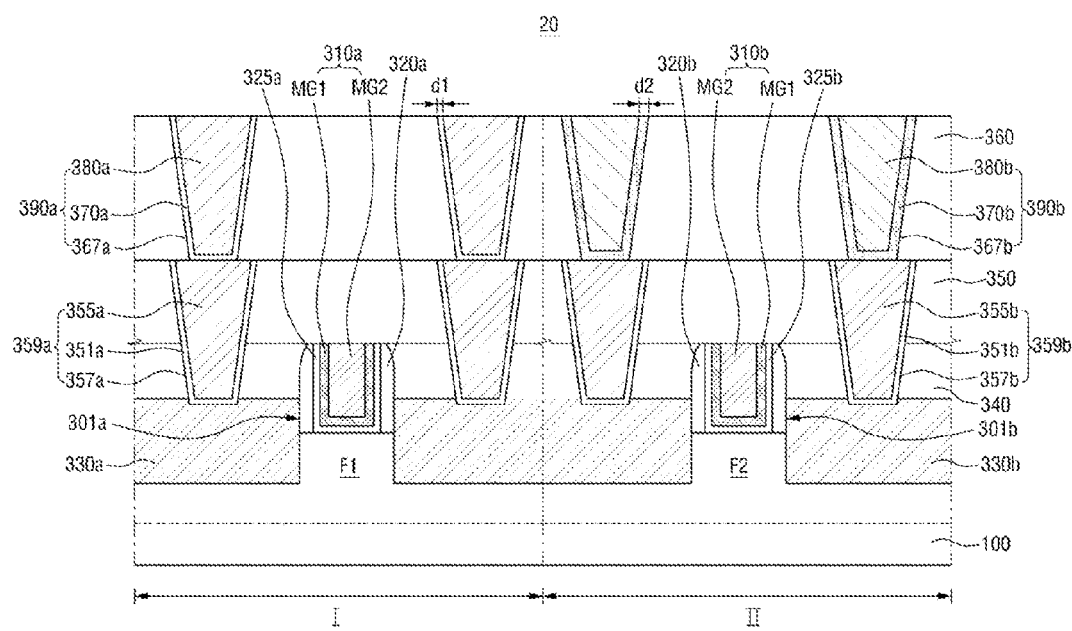
FIG. 16 is a cross-sectional view taken along lines A-A and B-B of FIG. 15.
Figure 17:
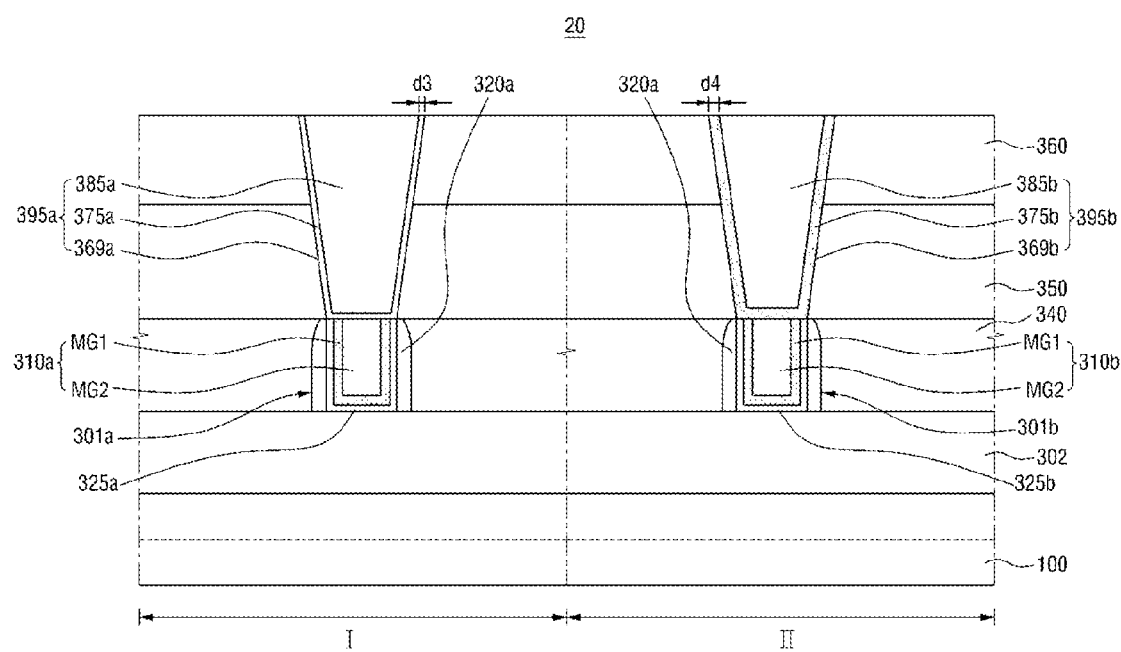
FIG. 17 is a cross-sectional view taken along lines C-C and D-D of FIG. 15.

FIG. 15 is a layout view illustrating a semiconductor device according to a fifteenth embodiment of the present inventive concepts, FIG. 16 is a cross-sectional view taken along lines A-A and B-B of FIG. 15 and FIG. 17 is a cross-sectional view taken along lines C-C and D-D of FIG. 15.

In FIG. 16, cross sections of first and second transistors 301a and 301b, taken along the Y-axis direction, are illustrated. A top surface of the first interlayer insulation layer 340 may be parallel with a top surface of the gate electrode 310a. The top surface of the first interlayer insulation layer 340 and the top surface of the gate electrode 310a become parallel with each other by planarization (e.g., CMP). The second interlayer insulation layer 350 may be formed to cover the gate electrode 310a. A first spacer 320a is formed on sidewalls of the gate electrode 310a. A second spacer 320a may be formed along the lateral surfaces of the first spacer 320a. The second spacer 320a may be substantially I-shaped, rather than L-shaped.

A first contact plug 359a may include a first trench 357a, a first barrier metal 351a, and a first conductive layer 380a. Likewise, a second contact plug 359b may include a second trench 357b, a second barrier metal 351b, and a second conductive layer.

A first contact 390a may be formed on the first contact plug 359a. The first contact 390a may include a first contact hole 367a, a first work function control layer 370a, and a third conductive layer 380a. A second contact 390b may be formed on the second contact plug 359b. The second contact 390b may include a second contact hole 367b, a second work function control layer 370b, and a fourth conductive layer 380b.

The first and second contact plugs 359a and 359b and the first and second contacts 390a and 390b may be formed in substantially the same manner with the first and second contact plugs 159a and 159b and the first and second contacts 190a and 190b of the semiconductor device 1 shown in FIG. 1. That is to say, the first thickness d1 of the first work function control layer 370a and the second thickness d2 of the second work function control layer 370b may be different from each other.

The second work function control layer 370b may have a different material from the first work function control layer 370a or may include a material having a different concentration from the first work function control layer 370a. For example, the first work function control layer 370a and the second work function control layer 370b may be formed to have the same thickness and may include the same metal. Here, a concentration of the metal included in the first work function control layer 370a may be different from a concentration of the metal included in the second work function control layer 370b. In some embodiments of the present inventive concepts, since the first work function control layer 370a and the second work function control layer 370b include different materials, they may have different work functions.

The first contact 390a and the second contact 390b may have different work functions due to differences in the thickness, the constituent material and the concentration of the constituent material between the first work function control layer 370a and the second work function control layer 370b. Contact resistance between the first transistor 301a and the first contact 390a may be controlled by controlling the work function of the first contact 390a.

Accordingly, an operating work function of the first transistor 301a electrically connected to the first contact 390a may be controlled and operating characteristics of the first transistor 301a may be controlled. A work function of the second transistor 301b electrically connected to the second contact 390b may be controlled and operating characteristics of the second transistor 301b may be controlled.

In FIG. 17, cross sections of first and second transistors 301a and 301b, taken along the X-axis direction, are illustrated.

A first contact 395a may be formed on the first gate electrode 310a of the first transistor 301a. A bottoms surface of the first contact 395a may contact or may be electrically connected to the first gate electrode 310a.

The first contact 395a may be formed on the first transistor 301a. The first contact 395a may include a first contact hole 369a, a first work function control layer 375a, and a first conductive layer 385a.

The first contact hole 369a may be formed to pass through a second interlayer insulation layer 350 and a third interlayer insulation layer 360. The first contact hole 369a may be formed on the first transistor 301a and may expose a portion of the first transistor 301a. For example, the first contact hole 369a may expose a gate electrode 310a of the first transistor 301a.

The first work function control layer 375a may be conformally formed on an inner surface of the first contact hole 369a. That is to say, the first work function control layer 375a may be formed on opposite lateral surfaces and a bottom surface of the first contact hole 369a to a third thickness d3, but aspects of the present inventive concepts are not limited thereto. The first conductive layer 385a may be disposed on the first work function control layer 375a and may be formed to fill the first contact hole 369a.

Likewise, a second contact 395b may be formed on the second transistor 301b. The second contact 395b may include a second contact hole 369b, a second work function control layer 375b, and a second conductive layer 385b.

A second contact hole 369b may be formed to pass through a second interlayer insulation layer and a third interlayer insulation layer. The second contact hole 369b may be formed on the second transistor 301b and may expose a portion of the second transistor 301b. For example, the second contact hole 369b may expose a gate electrode 310b of the second transistor 301b.

The second work function control layer 375b may be conformally formed on an inner surface of the second contact hole 369b. That is to say, the second work function control layer 375b may be formed on opposite lateral surfaces and a bottom surface of the second contact hole 369b to a fourth thickness d4, but aspects of the present inventive concepts are not limited thereto. The second conductive layer 385b may be disposed on the second work function control layer 375b and may be formed to fill the second contact hole 369b.

The third thickness d3 of the first work function control layer 375a and the fourth thickness d4 of the second work function control layer 370b may be equal to or different from each other.

The second work function control layer 375b may have a different material from the first work function control layer 375a or may include a material having a different concentration from the first work function control layer 375a. For example, the first work function control layer 375a and the second work function control layer 375b may be formed to have the same thickness and may include the same metal. Here, a concentration of the metal included in the first work function control layer 375a may be different from a concentration of the metal included in the second work function control layer 375b. In addition, in some embodiments of the present inventive concepts, since the first work function control layer 375a and the second work function control layer 375b include different materials, they may have different work functions.

The first contact 395a and the second contact 395b may have different work functions due to differences in the thickness, the constituent material and the concentration of the constituent material between the first work function control layer 375a and the second work function control layer 375b. Contact resistance between the gate electrode of the first transistor 301a and the first contact 395a may be controlled by controlling the work function of the first contact 395a. Accordingly, an operating work function of the first transistor 301a electrically connected to the first contact 395a may be controlled and operating characteristics of the first transistor 301a may be controlled. Likewise, a work function of the second transistor 301b electrically connected to the second contact 395b may be controlled and operating characteristics of the second transistor 301b may be controlled.

The first and second contacts 395a and 395b electrically connected to the sources or drains of the first and second transistors 301 and 301b shown in FIG. 16, and the first and second contacts 395a and 395b electrically connected to the gate electrodes of the first and second transistors 301 and 301b shown in FIG. 17 may be simultaneously or individually implemented.

Semiconductor devices according to sixteenth and seventeenth embodiments of the present inventive concepts will be described with reference to FIGS. 18 and 19.

Figure 18:
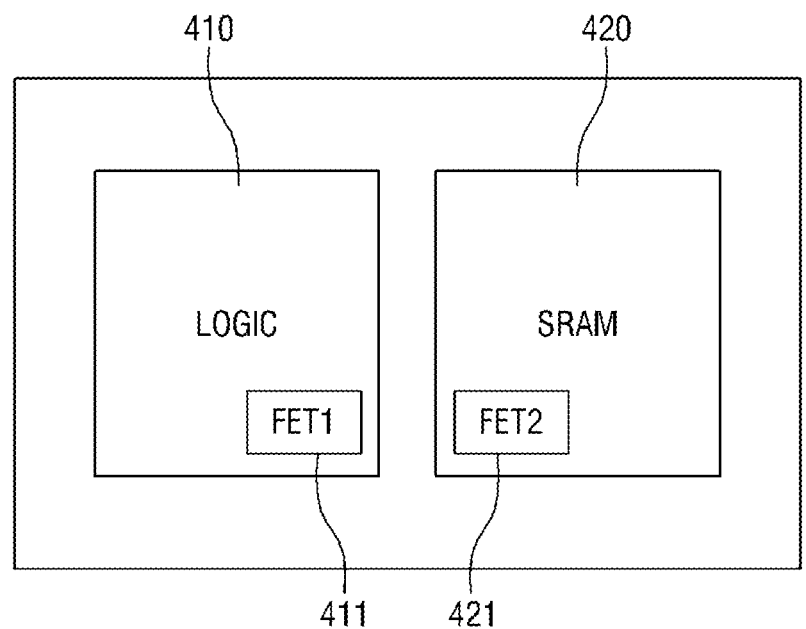
FIG. 18 illustrates a semiconductor device according to a sixteenth embodiment of the present inventive concepts.
Figure 19:
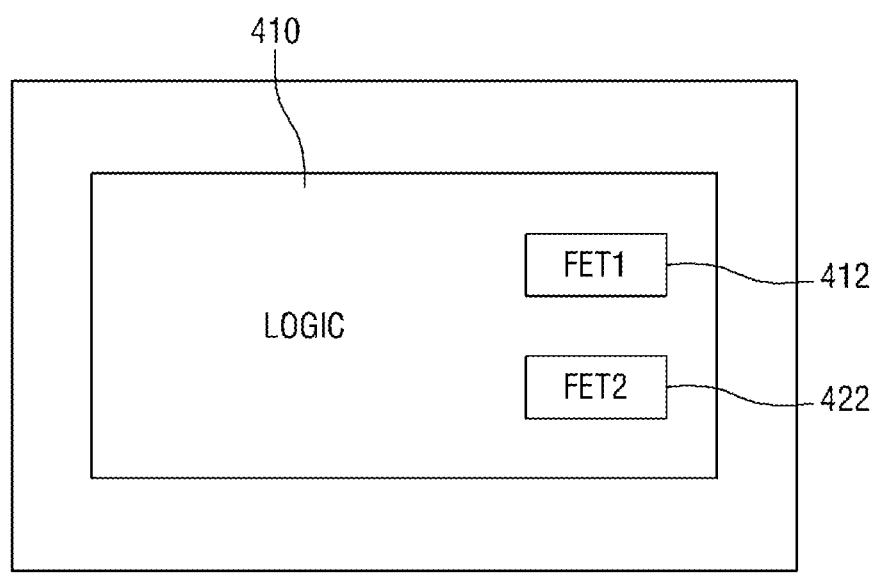
FIG. 19 illustrates a semiconductor device according to a seventeenth embodiment of the present inventive concepts.

FIG. 18 illustrates a semiconductor device according to a sixteenth embodiment of the present inventive concepts and FIG. 19 illustrates a semiconductor device according to a seventeenth embodiment of the present inventive concepts.

The following description will focus on differences between the present embodiment and the previous embodiments of the present inventive concepts.

First, referring to FIG. 18, the semiconductor device 24 according to the sixteenth embodiment of the present inventive concepts may include a logic region 410 and an SRAM forming region 420. A first transistor 411 may be disposed on the logic region 410 and a second transistor 421 may be disposed on the SRAM forming region 420.

Next, referring to FIG. 19, the semiconductor device 25 according to the seventeenth embodiment of the present inventive concepts may include a logic region 410, and third and fourth transistors 412 and 422 different from each other may be disposed in the logic region 410. Meanwhile, although not separately shown, third and fourth transistors 412 and 422 different from each other may also be disposed in an SRAM forming region.

Here, the first transistor 411 may be one of the semiconductor devices 1 to 7, 10 to 12 and 20 according to the above-described embodiments of the present inventive concepts, and the second transistor 421 may be another one of the semiconductor devices 1 to 7, 10 to 12 and 20 according to the above-described embodiments of the present inventive concepts. For example, the first transistor 411 may be the semiconductor device 1 shown in FIG. 1, and the second transistor 421 may be the semiconductor device 2 shown in FIG. 2.

The third transistor 412 may be one of the semiconductor devices 1 to 7, 10 to 12 and 20 according to the above-described embodiments of the present inventive concepts, and the fourth transistor 422 may be another one of the semiconductor devices 1 to 7, 10 to 12 and 20 according to the above-described embodiments of the present inventive concepts.

In FIG. 18, the logic region 410 and the SRAM forming region 420 are exemplified, but aspects of the present inventive concepts are not limited thereto. For example, the present inventive concepts may also be applied to the logic region 410 and regions for forming other types of memories (e.g., DRAM, MRAM, RRAM, PRAM, etc.).

Figure 20:
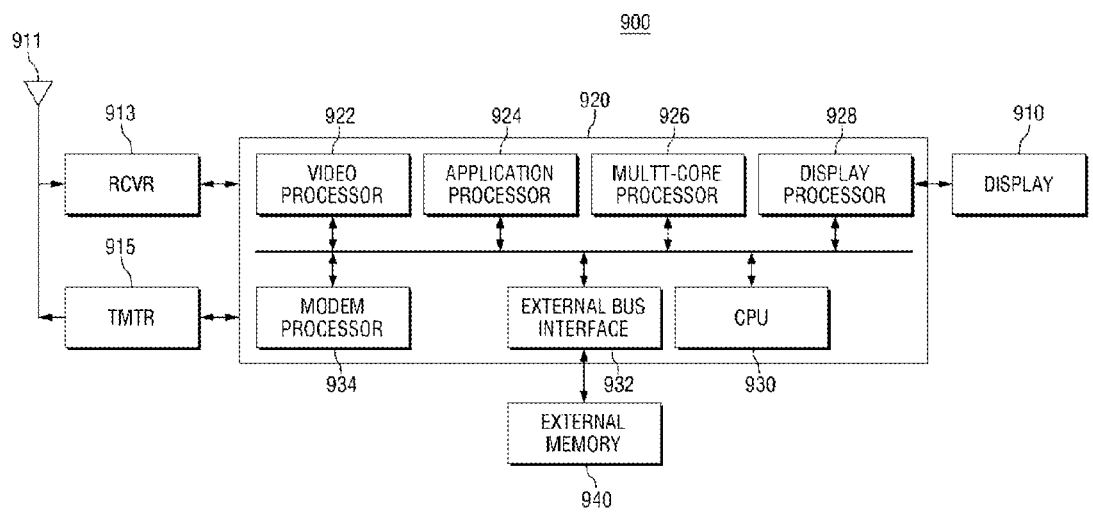
FIG. 20 is a block diagram illustrating a wireless communication device including semiconductor devices according to embodiments of the present inventive concepts.

FIG. 20 is a block diagram illustrating a wireless communication device including semiconductor devices according to embodiments of the present inventive concepts.

Referring to FIG. 20, the wireless communication device 900 may be a cellular phone, a smart phone, a handset, a personal digital assistant (PDA), a laptop computer, a video game unit or other types of devices. The wireless communication device 900 may adopt code division multiple access (CDMA), time division multiple access (TDMA) such as a global system for mobile communications (GSM), or other types of wireless communication standards.

The wireless communication device 900 may provide bi-directional communication through a reception path and a transmission path. On the reception path, signals transmitted by one or more base stations may be received by an antenna 911 or may be provided to a receiver (RCVR) 913. The receiver 913 may condition and digitalize the received signals and may provide samples to a digital section 920 for further processing. On the transmission path, a transmitter (TMTR) 915) may receive the data transmitted from the digital section 920, may process and condition the data and may generate modulated signals to be transmitted to one or more base stations through the antenna 911.

The digital section 920 may be implemented by one or more digital signal processors (DSPs), a micro-processor, or a reduced instruction set computer (RISC). The digital section 920 may be fabricated on one or more application specific integrated circuits (ASICs) or other types of ICs.

The digital section 920 may include, for example, various processing and interface units, such as a modem processor 934, a video processor 922, an application processor 924, a display processor 928, a controller/multi-core processor 926, a central processing unit 930, and an external bus interface (EBI) 932.

The video processor 922 may perform processing on graphic applications. In general, the video processor 922 may include an arbitrary number of processing units or modules for an arbitrary set of graphic operations. Particular parts of the video processor 922 may be implemented by firmware and/or software. For example, a control unit may be implemented by firmware and/or software modules for performing the above-described functions (e.g., procedures, functions, etc.). Firmware and/or software codes may be stored in a memory or may be executed by a processor (e.g., the multi-core processor 926). The memory may be implemented inside or outside the processor.

The video processor 922 may implement software interface such as open graphic library (OpenGL) or Direct3D. The central processing unit 930 may perform a series of graphic processing operations with the video processor 922. The controller/multi-core processor 926, including at least two cores, may allocate workloads to the at least two cores according to the workload to be processed by the controller/multi-core processor 926 and may simultaneously process the corresponding workloads.

In the illustrated embodiment, the application processor 924 is exemplified as a component of the digital section 920, but aspects of the present inventive concepts are not limited thereto. In some embodiments of the present inventive concepts, the digital section 920 may be incorporated into one application processor 924 or an application chip.

The modem processor 934 may perform operations required during data transmission between the receiver 913, the transmitter 915 and the digital section 920. The display processor 928 may perform operations required to drive the display 910.

The semiconductor devices 1 to 7, 10 to 12 and 20 according to the above-described embodiments of the present inventive concepts may be used as cache memories or buffer memories used in performing operations of the processors 922, 924, 926, 928, 930 and 934.

Next, a computing system including a semiconductor device according to embodiments of the present inventive concepts will be described with reference to FIG. 21.

Figure 21:
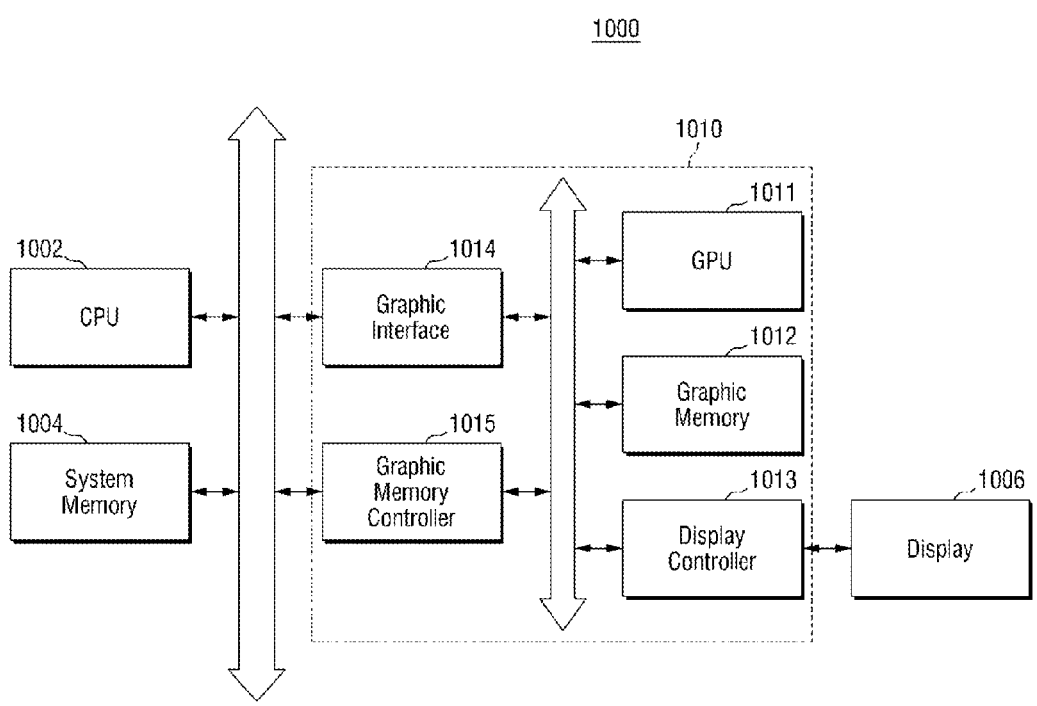
FIG. 21 is a block diagram illustrating a computing system including semiconductor devices according to embodiments of the present inventive concepts.

FIG. 21 is a block diagram illustrating a computing system including semiconductor devices according to embodiments of the present inventive concepts.

Referring to FIG. 21, the computing system 1000 according to an embodiment of the present inventive concepts includes a central processing unit (CPU) 1002, a system memory 1004, a graphic system 1010, and a display device 1006.

The CPU 1002 may perform operations required to drive the computing system 1000. The system memory 1004 may be configured to store data. The system memory 1004 may store data processed by the CPU 1002. The system memory 1004 may function as a working memory of the CPU 1002. The system memory 1004 may include one or more volatile memory devices such as a double data rate synchronous dynamic random access memory (DDR SDRAM) or a single data rate synchronous dynamic random access memory (SDR SDRAM), and/or one or more nonvolatile memory devices such as an electrical erasable programmable ROM (EEPROM) or a flash memory. One of the semiconductor devices 1 to 7, 10 to 12 and 20 according to the above-described embodiments of the present inventive concepts may be employed as a component of the system memory 1004.

The graphic system 1010 may include a graphic processing unit (GPU) 1011, a graphic memory 1012, a display controller 1013, a graphic interface 1014, and a graphic memory controller 1015.

The GPU 1011 may perform graphic operations required for the computing system 1000. In detail, the GPU 1011 may assemble primitives including one or more vertexes and may perform rendering using the assembled primitives.

The graphic memory 1012 may store graphic data processed by the GPU 1011 or may store data provided to the GPU 1011. Alternatively, the graphic memory 1012 may function as a working memory of the GPU 1011. One of the semiconductor devices 1 to 6 according to the above-described embodiments of the present inventive concepts may be employed as a component of the graphic memory 1012.

The display controller 1013 may control the display 1006 to display a rendered image frame.

The graphic interface 1014 may interface between the CPU 1002 and the GPU 1011, and the graphic memory controller 1015 may provide memory access between the system memory 1004 and the GPU 1011.

Referring to FIG. 21, the computing system 1000 may further include one or more input devices, such as a mouse, a button, a keypad, a touch screen or a mike, and/or one or more output devices, such as a speaker. In addition, the computing system 1000 may further include an interface transmitting data to a communication network or receiving data from the communication network. The interface may include, for example, an antenna or a wired/wireless transceiver.

According to embodiments, the computing system 1000 may be an arbitrary computing system, such as a mobile phone, a smart phone, a personal digital assistant (PDA), a desktop, a notebook computer, or a tablet PC.

Next, an electronic system including semiconductor devices according to embodiments of the present inventive concepts will be described with reference to FIG. 22.

Figure 22:
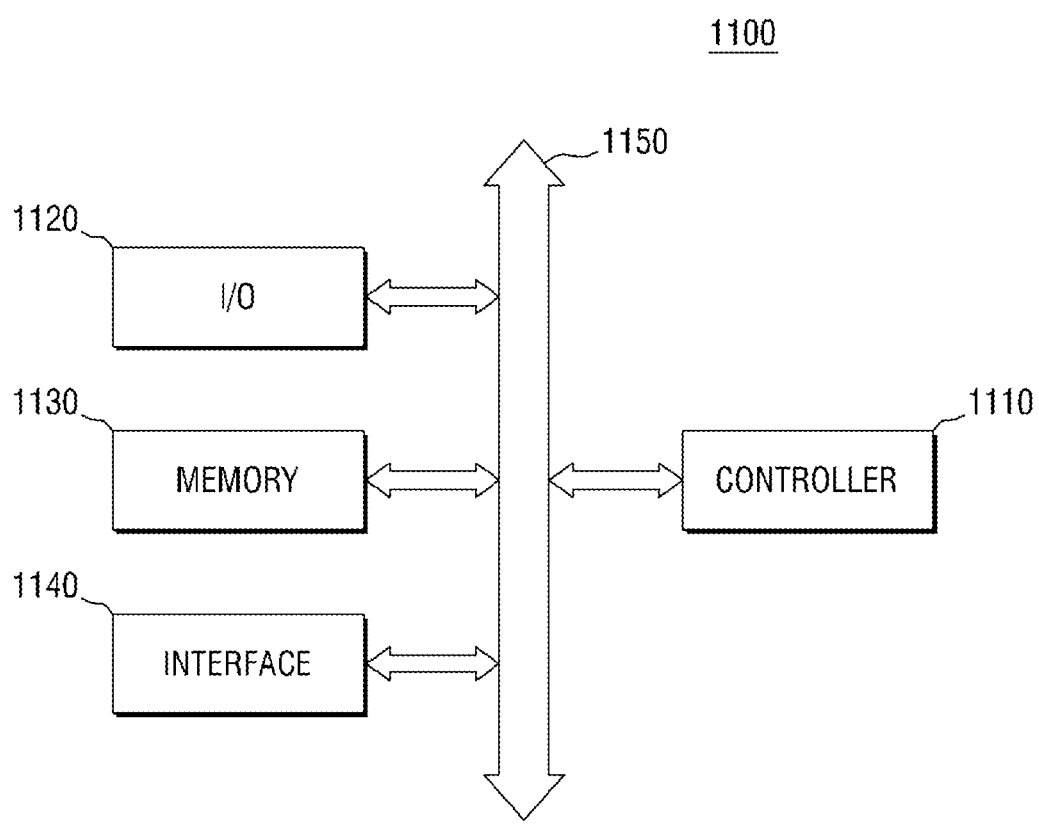
FIG. 22 is a block diagram of an electronic system including semiconductor devices according to embodiments of the present inventive concepts.

FIG. 22 is a block diagram of an electronic system including semiconductor devices according to embodiments of the present inventive concepts.

Referring to FIG. 22, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on.

The electronic system 1100 may further include high-speed DRAM and/or SRAM as a working memory for improving the operation of the controller 1110. The semiconductor devices 1 to 7, 10 to 12 and 20 according to some embodiments of the present inventive concepts may be provided in the memory device 1130 or may be provided as some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 23:
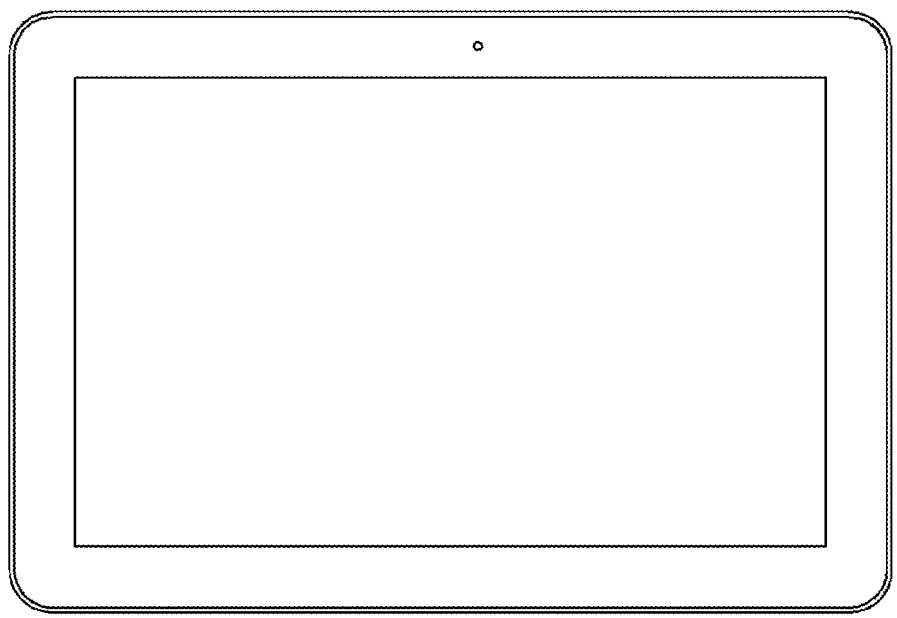
FIGS. 23 to 25 illustrate example electronic systems to which semiconductor devices according to some embodiments of the present inventive concepts can be applied.
Figure 24:
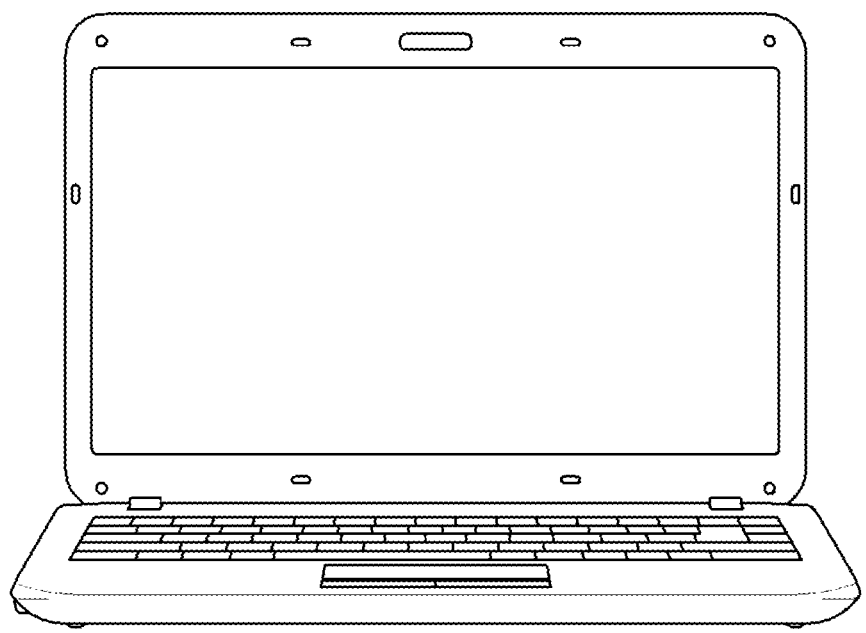
Figure 25:
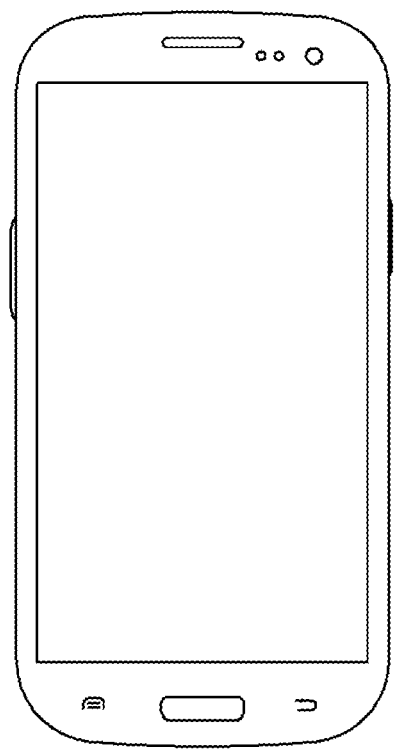

FIGS. 23 to 25 illustrate example electronic systems to which semiconductor devices according to some embodiments of the present inventive concepts can be applied.

FIG. 23 illustrates an example in which a semiconductor device according to an embodiment of the present inventive concepts is applied to a tablet PC (1200), FIG. 24 illustrates an example in which a semiconductor device according to an embodiment of the present inventive concepts is applied to a notebook computer (1300), and FIG. 25 illustrates an example in which a semiconductor device according to an embodiment of the present inventive concepts is applied to a smart phone (1400). At least one of the semiconductor devices 1, 2 and 3 according to some embodiments of the present inventive concepts can be employed to a tablet PC 1200, a notebook computer 1300, a smart phone 1400, and the like.

It is obvious to one skilled in the art that the semiconductor devices 1, 2 and 3 according to some embodiments of the present inventive concepts may also be applied to other IC devices not illustrated herein. That is to say, in the above-described embodiments, only the tablet PC 1200, the notebook computer 1300 and the smart phone 1400 have been exemplified as the semiconductor devices according to the embodiments of the present inventive concepts, but aspects of the present inventive concepts are not limited thereto. In some embodiments of the present inventive concepts, the semiconductor system may be implemented as a computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, or the like.

The present inventive concepts provides a semiconductor device, which can improve operating characteristics of a transistor by controlling a work function of a contact connected to the transistor.

The present inventive concepts also provides a method for fabricating a semiconductor device, which can improve operating characteristics of a transistor by controlling a work function of a contact connected to the transistor.

While the present inventive concepts has been particularly shown and described with reference to example embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concept.

What is claimed is:

1. A semiconductor device comprising:
a substrate including a first region and a second region;
a first transistor and a second transistor on the first region and the second region, respectively;
a first contact on the first transistor, the first contact including a first work function control layer and a first conductive layer on the first work function control layer, the first work function control layer having a first thickness and the first work function control layer on opposite lateral surfaces and a bottom surface of a first contact hole as a single layer within a first interlayer dielectric on the first transistor;
a first contact plug on the first transistor, and the first contact plug between the first contact and the first transistor;
a second contact on the second transistor, the second contact including a second work function control layer and a second conductive layer on the second work function control layer, the second work function control layer having a second thickness and a material having a different concentration from the first work function control layer, the second thickness being different from the first thickness and the second work function control layer on opposite lateral surfaces and a bottom surface of a second contact hole as a single layer within the first interlayer dielectric on the second transistor and having a material; and
a second contact plug on the second transistor, and the second contact plug between the second contact and the second transistor,
wherein the first contact and the second contact have different work functions and the first work function control layer and the second work function control layer directly contacts an upper surface of the respective first contact plug and the second contact plug.

2. The semiconductor device of claim 1, wherein,
the first transistor includes a first source or drain,
the second transistor includes a second source or drain,
the first contact is on the first source or drain and is electrically connected to the first source or drain through the first contact plug, and
the second contact is on the second source or drain and is electrically connected to the second source or drain through the second contact plug.

3. The semiconductor device of claim 1, wherein the first transistor and the second transistor have different conductivity types.

4. The semiconductor device of claim 1, wherein the first work function control layer and the second work function control layer include different materials.

5. The semiconductor device of claim 1, wherein,
the first work function control layer and the second work function control layer include a common metal, and
a concentration of the metal included in the first work function control layer and a concentration of the metal included in the second work function control layer are different from each other.

6. The semiconductor device of claim 1, wherein the first work function control layer and the second work function control layer include different metals.

7. A semiconductor device comprising:
a substrate including a first region and a second region;
a first transistor and a second transistor on the first region and the second region, respectively;
a first contact on the first transistor, the first contact including a first work function control layer and a first conductive layer on the first work function control layer, the first work function control layer having a first thickness and the first work function control layer on opposite lateral surfaces and a bottom surface of a first contact hole as a single layer within a first interlayer dielectric on the first transistor;
a first contact plug on the first transistor, and the, first contact plug between the first contact and the first transistor;
a second contact on the second transistor, the second contact including a second work function control layer and a second conductive layer on the second work function control layer, the second work function control layer having a second thickness, the second thickness being different from the first thickness and the second work function control layer on opposite lateral surfaces and a bottom surface of a second contact hole as a single layer within the first interlayer dielectric on the second transistor, the second work function control layer including at least one of,
a different material from the first work function control layer, or
a material having a different concentration from the first work function control layer; and
a second contact plug on the second transistor, and the second contact plug between the second contact and the second transistor,
wherein the first contact and the second contact have different work functions and the first work function control layer and the second work function control layer directly contacts an upper surface of the respective first contact plug and the second contact plug.

8. The semiconductor device of claim 7, wherein,
the first work function control layer and the second work function control layer are formed to different thicknesses and include a same metal, and
a concentration of the metal included in the first work function control layer and a concentration of the metal included in the second work function control layer are different from each other.

9. The semiconductor device of claim 7, wherein the first work function control layer and the second work function control layer include different materials.

10. The semiconductor device of claim 7, wherein the first or second work function control layer includes Ti, TiN, WN, HfO, Ga, or Ge.

11. The semiconductor device of claim 7, wherein,
the first transistor includes a first source or drain, the second transistor includes a second source or drain,
the first contact is on the first source or drain and is electrically connected to the first source or drain through the first contact plug, and
the second contact is on the second source or drain and is electrically connected to the second source or drain through the second contact plug.

* * * * *